US008227806B2

(12) United States Patent
Yamazaki et al.

(10) Patent No.: US 8,227,806 B2
(45) Date of Patent: Jul. 24, 2012

(54) ACTIVE MATRIX DISPLAY IN WHICH LDD REGIONS IN THE DRIVER CIRCUIT AND THE STORAGE CAPACITOR IN THE PIXEL SECTION HAVE THE SAME DOPANT CONCENTRATION

(75) Inventors: Shunpei Yamazaki, Tokyo (JP); Yasuyuki Arai, Kanagawa (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 125 days.

(21) Appl. No.: 11/787,749

(22) Filed: Apr. 17, 2007

(65) Prior Publication Data

US 2007/0205413 A1  Sep. 6, 2007

Related U.S. Application Data

(62) Division of application No. 10/966,942, filed on Oct. 15, 2004, now Pat. No. 7,348,599, which is a division of application No. 09/610,753, filed on Jul. 6, 2000, now Pat. No. 6,952,020.

(30) Foreign Application Priority Data

Jul. 6, 1999  (JP) .................................. 11-191097

(51) Int. Cl.
  *H01L 29/04* (2006.01)
  *H01L 29/786* (2006.01)
(52) U.S. Cl. ............... 257/59; 257/71; 257/72; 257/83; 257/303; 257/350; 257/351

(58) Field of Classification Search .................... 257/59, 257/71, 72, 83, 303, 350, 351
See application file for complete search history.

(56) References Cited

U.S. PATENT DOCUMENTS

| 5,042,919 | A | * | 8/1991 | Yabu et al. ..................... 349/150 |
| 5,323,042 | A | * | 6/1994 | Matsumoto .................... 257/350 |
| 5,424,244 | A | | 6/1995 | Zhang et al. |
| 5,508,209 | A | | 4/1996 | Zhang et al. |
| 5,563,427 | A | | 10/1996 | Yudasaka et al. |
| 5,583,369 | A | | 12/1996 | Yamazaki et al. |

(Continued)

FOREIGN PATENT DOCUMENTS
EP  0 871 227 A2  10/1998
(Continued)

OTHER PUBLICATIONS

US 7,198,991, 04/2007, Koyama et al. (withdrawn)

*Primary Examiner* — Ha Tran T Nguyen
*Assistant Examiner* — Raj R Gupta
(74) *Attorney, Agent, or Firm* — Husch Blackwell LLP

(57) ABSTRACT

A p channel TFT of a driving circuit has a single drain structure and its n channel TFT, a GOLD structure or an LDD structure. A pixel TFT has the LDD structure. A pixel electrode disposed in a pixel portion is connected to the pixel TFT through a hole bored in at least a protective insulation film formed of an inorganic insulating material and formed above a gate electrode of the pixel TFT, and in an interlayer insulating film disposed on the insulation film in close contact therewith. These process steps use 6 to 8 photo-masks.

14 Claims, 18 Drawing Sheets

U.S. PATENT DOCUMENTS

| | | | |
|---|---|---|---|
| 5,608,251 A | 3/1997 | Konuma et al. | |
| 5,620,905 A | 4/1997 | Konuma et al. | |
| 5,623,157 A | 4/1997 | Miyazaki et al. | |
| 5,643,826 A | 7/1997 | Ohtani et al. | |
| 5,712,495 A | 1/1998 | Suzawa | |
| 5,767,930 A * | 6/1998 | Kobayashi et al. | 349/42 |
| 5,804,878 A | 9/1998 | Miyazaki et al. | |
| 5,841,170 A * | 11/1998 | Adan et al. | 257/345 |
| 5,849,043 A | 12/1998 | Zhang et al. | |
| 5,856,689 A | 1/1999 | Suzawa | |
| 5,923,962 A | 7/1999 | Ohtani et al. | |
| 5,939,731 A | 8/1999 | Yamazaki et al. | |
| 5,946,561 A | 8/1999 | Yamazaki et al. | |
| 5,952,708 A | 9/1999 | Yamazaki | |
| 5,962,872 A | 10/1999 | Zhang et al. | |
| 5,965,919 A | 10/1999 | Yoo | |
| 5,982,002 A | 11/1999 | Takasu et al. | |
| 5,998,841 A | 12/1999 | Suzawa | |
| 6,031,290 A | 2/2000 | Miyazaki et al. | |
| 6,034,748 A | 3/2000 | Furuta | |
| 6,057,897 A | 5/2000 | Ichikawa et al. | |
| 6,066,860 A | 5/2000 | Katayama et al. | |
| 6,088,071 A | 7/2000 | Yamamoto et al. | |
| 6,104,040 A | 8/2000 | Kawachi et al. | |
| 6,121,652 A | 9/2000 | Suzawa | |
| 6,124,604 A | 9/2000 | Koyama et al. | |
| 6,162,510 A * | 12/2000 | Kashiwazaki et al. | 427/511 |
| 6,166,414 A | 12/2000 | Miyazaki et al. | |
| 6,198,133 B1 | 3/2001 | Yamazaki et al. | |
| 6,211,533 B1 | 4/2001 | Byun et al. | |
| 6,259,120 B1 | 7/2001 | Zhang et al. | |
| 6,281,552 B1 | 8/2001 | Kawasaki et al. | |
| 6,414,345 B1 | 7/2002 | Suzawa | |
| 6,448,612 B1 | 9/2002 | Miyazaki et al. | |
| 6,524,895 B2 | 2/2003 | Yamazaki et al. | |
| 6,566,684 B1 | 5/2003 | Suzawa | |
| 6,576,924 B1 | 6/2003 | Yamazaki et al. | |
| 6,576,926 B1 | 6/2003 | Yamazaki et al. | |
| 6,630,687 B1 | 10/2003 | Koyama et al. | |
| 6,777,254 B1 | 8/2004 | Yamazaki et al. | |
| 6,777,716 B1 | 8/2004 | Yamazaki et al. | |
| 6,936,844 B1 | 8/2005 | Yamazaki et al. | |
| 6,952,020 B1 | 10/2005 | Yamazaki et al. | |
| 7,102,169 B2 | 9/2006 | Koyama et al. | |
| 2001/0050401 A1 * | 12/2001 | Yamauchi | 257/412 |
| 2003/0100152 A1 * | 5/2003 | Konuma et al. | 438/164 |
| 2004/0211965 A1 | 10/2004 | Koyama et al. | |

FOREIGN PATENT DOCUMENTS

| | | | |
|---|---|---|---|
| JP | 4-369271 | | 12/1992 |
| JP | 5-102483 | | 4/1993 |
| JP | 6-258659 | | 9/1994 |
| JP | 06258659 A | * | 9/1994 |
| JP | 7-130652 | | 5/1995 |
| JP | 8-64830 | | 3/1996 |
| JP | 8-234212 | | 9/1996 |
| JP | 08234212 A | * | 9/1996 |
| JP | 9-120072 | | 5/1997 |
| JP | 09120072 A | * | 5/1997 |
| JP | 9-172183 | | 6/1997 |
| JP | 9-172184 | | 6/1997 |
| JP | 10-198292 | | 7/1998 |
| JP | 10-284734 | | 10/1998 |
| JP | 11-45999 | | 2/1999 |

* cited by examiner

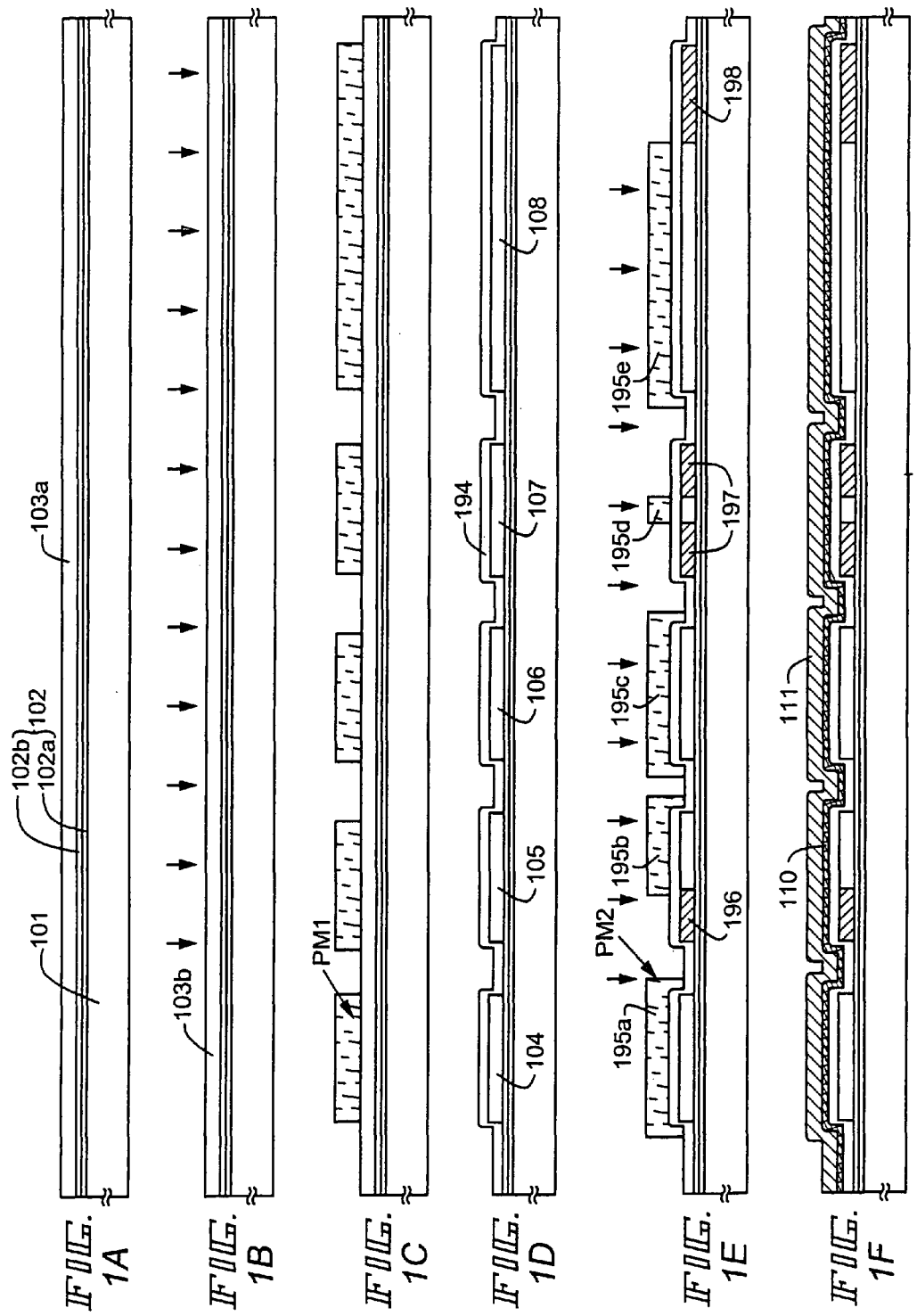

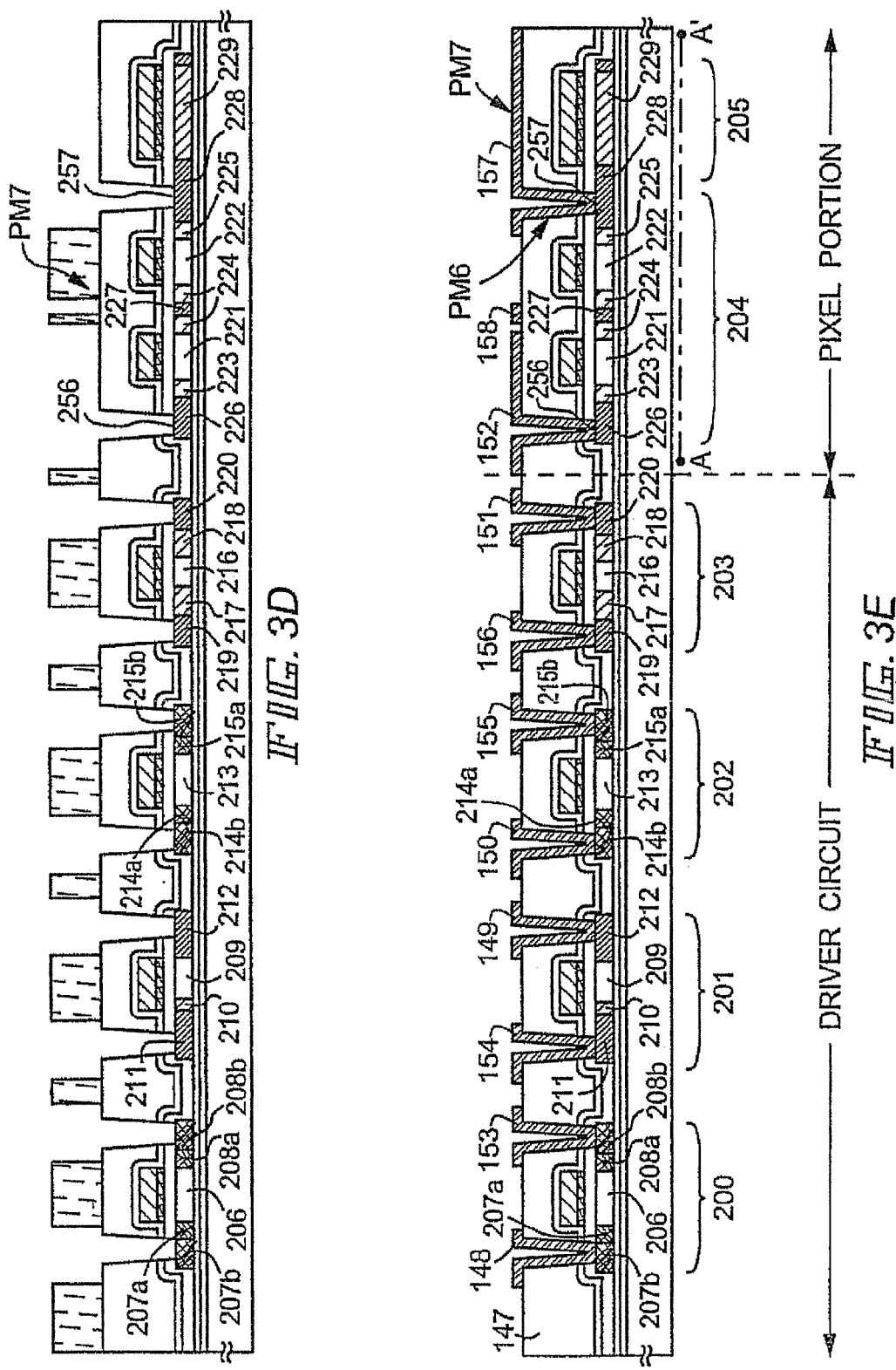

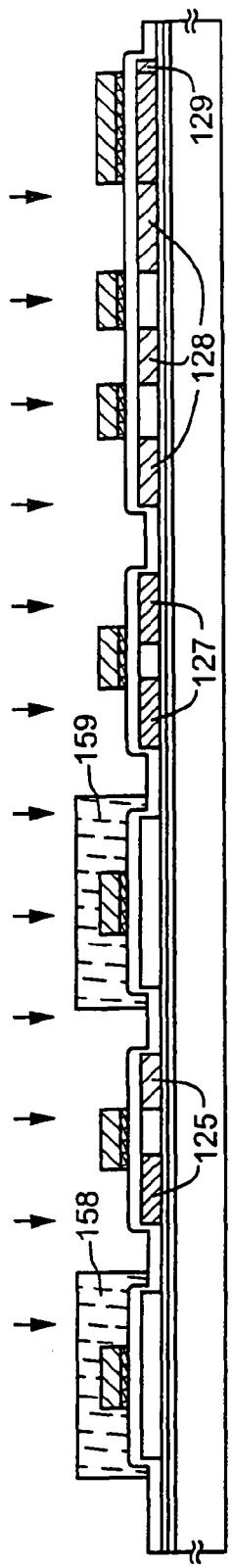
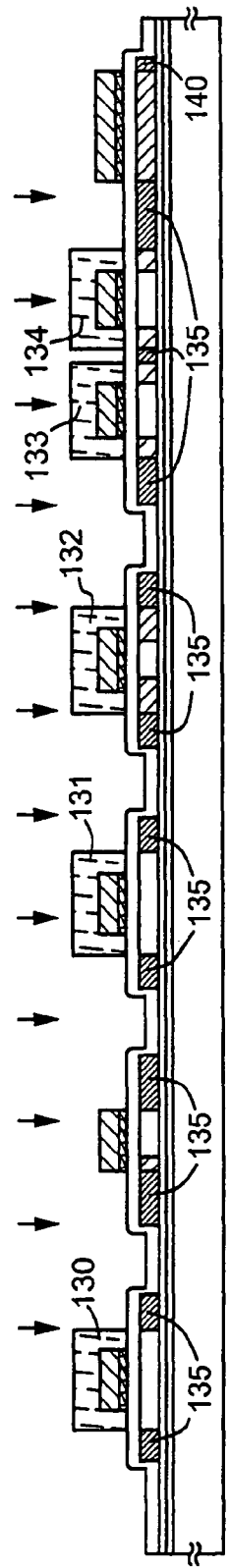
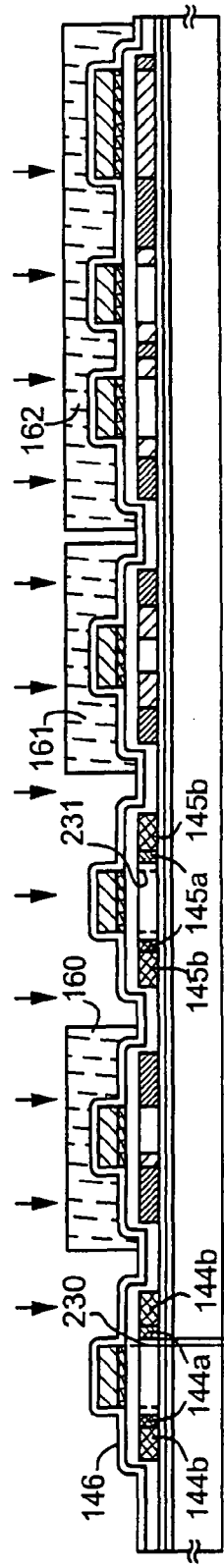

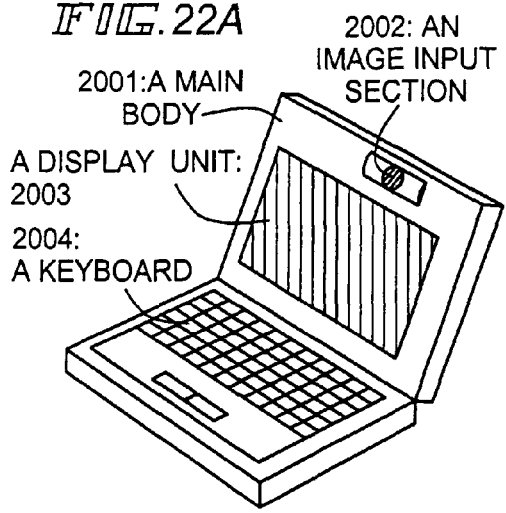
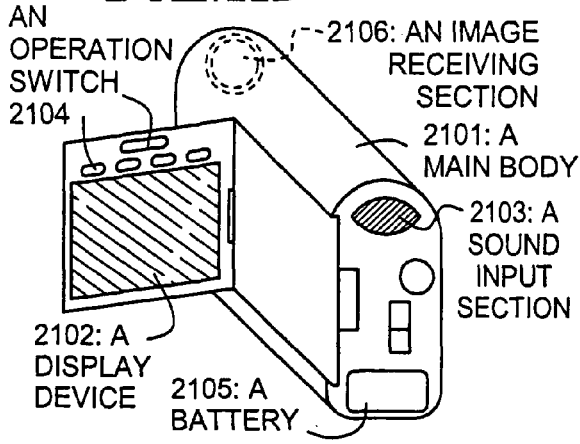
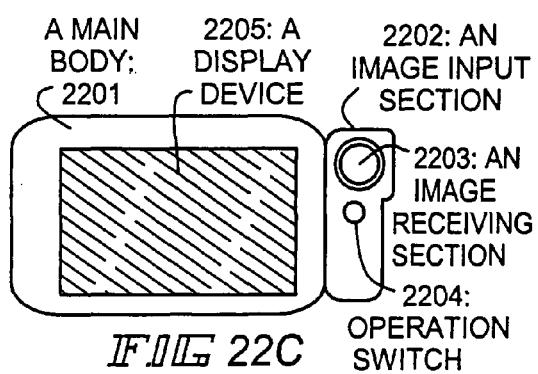
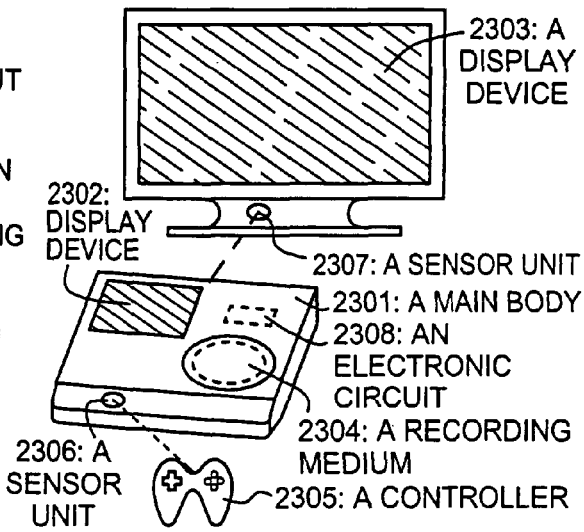
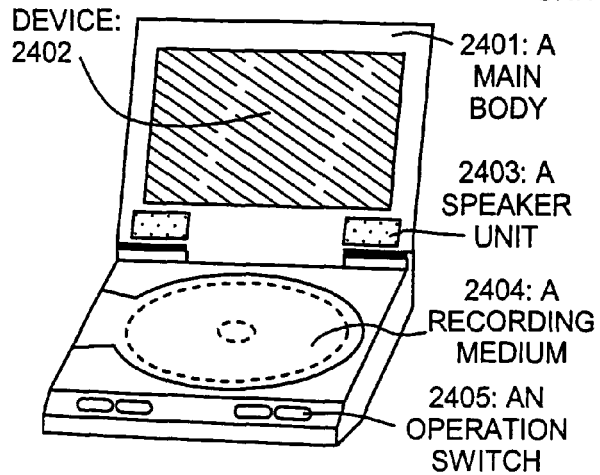
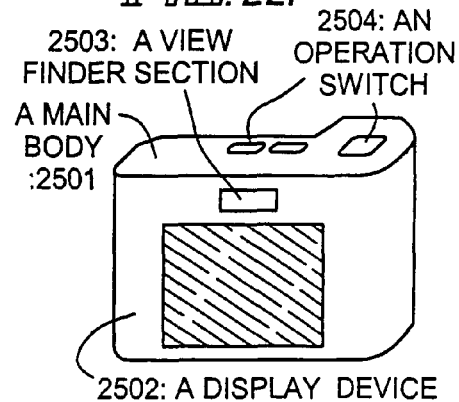

ACTIVE MATRIX DISPLAY IN WHICH LDD REGIONS IN THE DRIVER CIRCUIT AND THE STORAGE CAPACITOR IN THE PIXEL SECTION HAVE THE SAME DOPANT CONCENTRATION

This application is a divisional of U.S. application Ser. No. 10/966,942 filed on Oct. 15, 2004 now U.S. Pat. No. 7,348,599 which is a divisional of U.S. application Ser. No. 09/610,753, filed on Jul. 6, 2000 (now U.S. Pat. No. 6,952,020 issued Oct. 4, 2005).

BACKGROUND OF THE INVENTION

1. Field of the Invention

This invention relates to a semiconductor device having a circuit comprising thin film transistors (hereinafter referred to as "TFT") over a substrate having an insulating surface, and a fabrication method thereof. Specifically, the present invention provides a technology that will be appropriately used for an electro-optical device typified by a liquid crystal display device having a pixel section and a driving circuit disposed in the periphery the pixel section, and for an electronic appliance incorporating such an electro-optical device. Note that the term "semiconductor device" used herein represents those devices which operate by utilizing semiconductor characteristics, and embraces within its scope the electro-optical devices as well as the electronic appliances incorporating the electro-optical device that are described above.

2. Description of the Related Art

A technology that uses TFTs for constituting switching devices and active electric circuits has been developed in the electro-optical device typified by an active matrix liquid crystal display device. In the TFTs, a semiconductor film is grown over a substrate of a glass or the like by a vapor phase growth method, and the semiconductor film is used as an active layer. Silicon or a material consisting of silicon as the principal component such as silicon-germanium has been used appropriately for the semiconductor film. An amorphous silicon film and a crystalline silicon film represented by a polycrystalline silicon film can be obtained depending on the deposition method of the silicon semiconductor film.

The TFT using the amorphous silicon film for the active layer cannot essentially acquire field effect mobility of greater than several $cm^2/Vsec$ because of its electro-physical factors resulting from the amorphous structure, and so forth. Therefore, though it can be used as a switching element (pixel TFT) for driving a liquid crystal disposed at each pixel of a pixel section in an active matrix type liquid crystal device, the amorphous silicon film cannot form a driving circuit for effecting image display. For this reason, a technology of packaging a driver IC, etc, by using a TAB (Tape Automated Bonding) system or a COG (Chip on Glass) system has been employed.

On the other hand, the TFT using the crystalline silicon film for the active layer can acquire high field effect mobility and can form various functional circuits over the same glass substrate. The crystalline silicon film makes it possible to fabricate a shift register circuit, a level shifter circuit, a buffer circuit, a sampling circuit, and the like, each comprising a CMOS circuit including n-channel TFTs and p-channel TFTs in the driving circuit besides the pixel TFTs. To achieve the reduction of weight and thickness in the liquid crystal display device on the basis of such a technology, it became clear that the TFT using the crystalline semiconductor film, that can integrally form the driving circuit on the same substrate besides the pixel unit, for the active layer, is suitable.

Though the active layer using the crystalline silicon film is superior from the aspect of performance of the TFT, the fabrication steps become complicated and the number of process steps increases to form the TFT that can cope with various circuits besides the pixel TFTs. The increase of the number of process steps in turn results in the increase of the production cost and lowers also the production yield.

For example, the operating condition of the circuits are not always the same for the pixel TFT and the TFT of the driving circuit, and the characteristics required for each TFT are different. The pixel TFT comprises an n-channel TFT, applies the voltage and drives a liquid crystal as a switching device. Since the liquid crystal is driven by the alternating current, a system called "frame inversion driving" has been used widely. In this method, one of the characteristics required for the pixel TFT is to restrict an OFF current value (a drain current that flows when the TFT is under the OFF operation) to a sufficiently low level to limit power consumption low. On the other hand, a high driving voltage is applied to a buffer circuit of a control circuit so that the withstand voltage must be increased in order that the TFT is not broken even when a high voltage is applied thereto. To improve a current driving capacity, a sufficient ON current value (the drain current that flows when the TFT is under the ON operation) must be secured.

A lightly doped drain (LDD) structure is known as a TFT structure for reducing the OFF current value. This structure disposes an impurity region, to which an impurity element is added in a concentration lower than that of a source or drain region, between a channel formation region and the source or drain region that is formed by adding an impurity element in a high concentration. This impurity region is called the "LDD region". Further, there is known a so-called GOLD (gate-drain overlapped LDD) structure in which a LDD region is disposed so as to overlap a gate electrode by interposing a gate insulating film, as a means for preventing degradation of ON current value due to hot carriers. It is known that the high electric field in the proximity of the drain is released and the hot carrier injection is prevented by applying such a structure, and it is effective in preventing degrading phenomenon.

As described above, the required characteristics are not always the same between the pixel TFT and the TFT used for the driving circuit such as the shift register circuit or the buffer circuit. For example, a large reverse bias (a negative voltage in the case of the n-channel TFT) is applied to the gate of the pixel TFT, but the TFT of the driving circuit does not basically operate under the reverse bias state. As to the operation speed, too, the operation speed of the pixel TFT may not be higher than 1/100 of that of the TFT of the control circuit. Further, though GOLD structure has a high effect of preventing degradation of ON current value, on the other hand there was a problem that OFF current value becomes large as compared to ordinary LDD structure. Accordingly it was not a preferable structure for applying to the pixel TFT. On the contrary, ordinary LDD structure had a high effect for preventing OFF current value but it did not have effect of releasing electric field in the proximity of the drain and preventing degradation by hot carrier injection. As described above it was not always preferable to fabricate all the TFTs in a same structure, in a semiconductor device having a plurality of integrated circuits that have different operating condition as an active matrix liquid crystal display device. Such problems became apparent specifically in crystalline silicon TFTs as the characteristics enhanced and the performance required for an active matrix liquid crystal display device increased.

To stabilize the operation of these circuits fabricated by using the n- and p-channel TFTs, the threshold voltage and sub-threshold constant (S value) of the TFTs must be kept within predetermined ranges. For this purpose, the TFT must be examined from the aspects of both structure and material.

SUMMARY OF THE INVENTION

The present invention contemplates to provide a technology that solves these problems. In electro-optical devices and semiconductor devices typified by an active matrix liquid crystal device fabricated by using TFTs, the present invention is directed to improve the operation characteristics and reliability of the semiconductor devices and at the same time lower the power consumption, by optimizing the structures of the TFTs employed in various circuits in accordance with the functions of the respective circuits, thereby reducing the production cost and improving the production yield by reducing the number of process steps.

To accomplish the reduction of the production cost and the improvement of the production yield by reducing the number of process steps, the number of photo-masks used for the fabrication of the TFT must be reduced. In photolithography, the photo-mask is used for forming a resist pattern over the substrate as the mask in the etching process. Therefore, when one photo-mask is used, additional process steps such as resist removing, washing, drying, etc, are necessary before and after the step that uses the photo-mask in addition to the process steps of the film formation and etching. In the photolithography step, too, complicated process steps such as the application of the resist, pre-baking, exposure, development, post-baking, etc, are necessary.

To solve the problem described above, the present invention provides a semiconductor device having, over the same substrate, pixel TFTs disposed in a pixel section and a driving circuit including p-channel TFTs and n-channel TFTs and disposed round the pixel section, wherein: the p-channel TFT of the driving circuit comprises a channel forming region and a p-type impurity region having a fourth concentration, which forms a source region or a drain region; the n-channel TFT of the driving circuit comprises a channel forming region, an n-type impurity region having a first concentration, which is disposed in contact with the channel forming region and forms an LDD regions that overlap the gate electrode and that do not overlap the gate electrode, and an n-type impurity region of the third concentration, which is disposed outside the n-type impurity region having the first concentration and forms a source region or a drain region; the pixel TFT comprises a channel forming region, an n-type impurity region of the second concentration which is disposed in contact with the channel forming region and forms a LDD region, and an n-type impurity region of the third concentration which is disposed in the outside of the n-type impurity region of the second concentration and forms a source region or a drain region; and a pixel electrode disposed in the pixel section has a light reflecting surface and is formed over an interlayer insulating film made of an organic insulating material, and is connected to the pixel TFT through a hole formed in at least a protective insulating film made of an inorganic insulating material disposed over a gate electrode of said pixel TFT, and the interlayer insulating film formed on the insulating film in close contact therewith.

Another constitution of the present invention provides a semiconductor device having, on the same substrate, pixel TFTs disposed in a pixel section and a driving circuit comprising a p-channel TFT and an n-channel TFT which is disposed in the peripheral of the pixel section, wherein: the p-channel TFT of the driving circuit comprises a channel forming region and a p-type impurity region having a fourth concentration which forms a source region or a drain region; the n-channel TFT of the driving circuit comprises a channel forming region, an n-type impurity region having a first concentration which is disposed in contact with the channel forming region and forms a LDD region that partly overlap a gate electrode, and an n-type impurity region having a third concentration which is disposed outside the n-type impurity region having the first concentration and forms a source region or a drain region; the pixel TFT comprises a channel forming region, an n-type impurity region having the second concentration which is disposed in contact with the channel forming region and forms a LDD region, and an n-type impurity region having the third concentration which is disposed on the outside of the n-type impurity region having the second concentration and forms a source region or a drain region; and a pixel electrode disposed in the pixel section has a light transmitting surface and formed over an interlayer insulating film made of an organic insulating material, and is connected to a conductive metal lead wiring connected to the pixel TFT, through a hole formed at least in a protective insulating film made of an inorganic insulating material and disposed above a gate electrode of said pixel TFT and the interlayer insulating film formed on the insulating film in close contact therewith.

Another constitution of the present invention provides a semiconductor device having a liquid crystal sandwiched between a pair of substrates, wherein, in one of said substrates having a pixel TFT disposed in a pixel section and a driving circuits in which p-channel TFTs and n-channel TFTs are disposed in the periphery of the pixel section: the p-channel TFT of the driving circuit comprises a channel forming region and a p-type impurity region having a fourth concentration which forms a source region or a drain region; the n-channel TFT of said driving circuit comprises a channel forming region, an n-type impurity region having a first concentration which is disposed in contact with the channel forming region and forms a LDD region which partly overlaps a gate electrode, and an n-type impurity region having a third concentration disposed outside said n-type impurity region having the first concentration and forms a source region or a drain region; the pixel TFT comprises a channel forming region, an n-type impurity region having the second concentration which is disposed in contact with the channel forming region and forms a LDD region, and an n-type impurity region having the third concentration which is disposed on the outside of the n-type impurity region having the second concentration and forms a source region or a drain region; a pixel electrode disposed in the pixel section has a light reflecting surface and is formed over an interlayer insulating film made of an organic insulating material, and is connected to the pixel TFT through a hole formed in at least a protective insulating film made of an inorganic insulating material disposed over a gate electrode of said pixel TFT, and the interlayer insulating film formed on the insulating film in close contact therewith; and this one substrate is bonded to the other substrate having a transparent conductive film formed thereon through at least one columnar spacer formed in superposition with the hole.

Another constitution of the present invention provides a semiconductor device having a liquid crystal sandwiched between a pair of substrates, wherein, in one of the substrates comprising pixel TFTs of a pixel section and a driving circuit comprising p-channel TFTs and n-channel TFTs formed in the peripheral of the pixel section: the p-channel TFT of the driving circuit comprises a channel forming region and a p-type impurity region having a fourth concentration which forms a source region or a drain region; the n-channel TFT of the driving circuit comprises a channel forming region, an n-type impurity region having a first concentration, disposed in contact with the channel forming region and forms a LDD region that partly overlap a gate electrode, and an n-type impurity region having a third concentration disposed outside the n-type impurity region having the first concentration and forms a source region or a drain region; the pixel TFT comprises a channel forming region, an n-type impurity region having the second concentration which is disposed in contact with the channel forming region and forms a LDD region, and an n-type impurity region having the third concentration which is disposed on the outside of the n-type impurity region having the second concentration and forms a source region or a drain region; a pixel electrode disposed in the pixel section has a light transmitting property and is formed over an interlayer insulating film made of an organic insulating material and is connected to a conductive metal lead wiring connected to the pixel TFT through a hole formed in at least a protective insulating film made of an inorganic insulating material and disposed over a gate electrode and in the interlayer insulating film formed on the insulating film in close contact therewith; and the substrate is bonded to the other substrate having a transparent conductive film formed thereon, through at least one columnar spacer formed in superposition with the hole.

An offset region may be formed between the channel forming region and the p-type impurity region having the fourth concentration which forms a source region or a drain region in the p-channel TFT of the driving circuit, in the constitutions of the invention described above. Such p-channel TFT can be appropriately used as an analog switch.

Further, in the above aspect of the present invention, the semiconductor device is characterized in that a gate electrode of the pixel TFT of the pixel portion and the gate electrodes of the p-channel TFT and the n-channel TFT in the periphery of the pixel portion is formed of a heat-resistant conductive material, and gate wirings extending from the driver circuit to be connected to the gate electrodes are formed of a low-resistant conductive material. Preferably the heat-resistant conductive material is an element selected from the group consisting of tantalum (Ta), titanium (Ti), molybdenum (Mo), and tungsten (W); or a compound containing the above elements; or a compound of a combination of the above elements; or a nitride containing the above elements; or a silicide containing the above elements.

Still further, in the above aspect of the present invention, the semiconductor device is characterized in that the columnar spacer is formed on the p-channel TFT and the n-channel TFT of the driver circuit, or that the columnar spacer is formed at least covering the source wiring or the drain wiring of the p-channel TFT and the n-channel TFT of the driver circuit.

In order to solve the above problems, according to one aspect of the present invention, there is provided a method of manufacturing a semiconductor device having a pixel TFT formed in a pixel portion and a driver circuit, provided with a p-channel TFT and a n-channel TFT, formed in the periphery of the pixel portion on the same substrate, characterized by comprising the steps of: forming a base film in contact with the substrate; forming a plurality of island semiconductor layers on the base film; forming a first concentration n-type impurity region in a selected region of the island semiconductor layer for forming an LDD region of which a portion overlaps with a gate electrode of the n-channel TFT of the driver circuit; forming a second concentration n-type impurity region in a selected region of the island semiconductor layer for forming an LDD region of the pixel TFT; forming a third concentration n-type impurity region in the selected region of the island semiconductor layer for forming a source region or a drain region of the n-channel TFT of the driver circuit and the pixel TFT; forming a fourth concentration p-type impurity region in a selected region of the island semiconductor layer for forming a source region or a drain region of the p-channel TFT of the driver circuit; forming a protective insulating film made of an inorganic insulating material over a gate electrode of the n-channel TFT of the driver circuit, the pixel TFT, and the p-channel TFT; forming an interlayer insulating film made of an organic insulating material, in contact with the protective insulating film; and forming a pixel electrode having a light reflective surface and connected to the pixel TFT, on the interlayer insulating film.

Further, according to another aspect of the present invention, there is provided a method of manufacturing a semiconductor device having a pixel TFT formed in a pixel portion and a driver circuit, provided with a p-channel TFT and a n-channel TFT, formed in the periphery of the pixel portion on the same substrate, characterized by comprising the steps of: forming a base film over the substrate; forming a plurality of island semiconductor layers over the base film; forming a first concentration n-type impurity region in a selected region of the island-like semiconductor layer for forming an LDD region of which a portion overlaps with a gate electrode of the n-channel TFT of the driver circuit; forming a second concentration n-type impurity region in a selected region of the island semiconductor layer for forming an LDD region of the pixel TFT; forming a third concentration n-type impurity region in the selected region of the island semiconductor layer for forming a source region or a drain region of the n-channel TFT of the driver circuit and the pixel TFT; forming a fourth concentration p-type impurity region in a selected region of the island semiconductor layer for forming a source region or a drain region of the p-channel TFT of the driver circuit; forming a protective insulating film made of an inorganic insulating material over a gate electrode of the n-channel TFT of the driver circuit, the pixel TFT, and the p-channel TFT; forming an interlayer insulating film made of an organic insulating material in contact with the protective insulating film; forming a conductive metal wiring to be connected to the pixel TFT; and forming a pixel electrode made from a transparent conductive film to be connected to the conductive metal wiring, on the interlayer insulating film.

Further, according to still another aspect of the present invention, there is provided a method of manufacturing a semiconductor device having liquid crystal between a pair of substrates, characterized in that: a pixel TFT formed in a pixel portion and a driver circuit provided with a p-channel TFT and an n-channel TFT formed in the periphery of the pixel portion are formed on one substrate by the steps comprising: forming a base film over the substrate; forming a plurality of island semiconductor layers over the base film; forming a first concentration n-type impurity region in a selected region of the island semiconductor layer for forming an LDD region of which a portion overlaps with a gate electrode of the n-channel TFT of the driver circuit; forming a second concentration n-type impurity region in a selected region of the island semiconductor layer for forming an LDD region of the pixel TFT; forming a third concentration n-type impurity region in the selected region of the island semiconductor layer for forming a source region or a drain region of the n-channel TFT of the driver circuit and the pixel TFT; forming a fourth concentration p-type impurity region in a selected region of the island semiconductor layer for forming a source region or a drain region of the p-channel TFT of the driver circuit; forming a protective insulating film made of an inorganic insulating material over a gate electrode of the n-channel TFT of the driver circuit, the pixel TFT, and the p-channel TFT; forming an interlayer insulating film made of an organic insulating material in contact with the protective insulating film; and forming a pixel electrode having a light reflective surface to be connected to the pixel TFT via an opening provided in the interlayer insulating film and the protective insulating film, on the interlayer insulating film, and the other substrate is formed by at least a step comprising forming a transparent conductive film; and that the method comprises a step of sticking the one substrate and the other substrate together via at least one of the column-shape spacers formed overlapping the opening.

Further, according to yet another aspect of the present invention, there is provided a method of manufacturing a semiconductor device having liquid crystal between a pair of substrates, characterized in that: a pixel TFT formed in a pixel portion and a driver circuit provided with a p-channel TFT and an n-channel TFT formed in the periphery of the pixel portion are formed on one substrate by the steps comprising: forming a base film over the substrate; forming a plurality of island semiconductor layers over the base film; forming a first concentration n-type impurity region in a selected region of the island semiconductor layer for forming an LDD region of which a portion overlaps with a gate electrode of the n-channel TFT of the driver circuit; forming a second concentration n-type impurity region in a selected region of the island semiconductor layer for forming an LDD region of the pixel TFT, forming a third concentration n-type impurity region in the selected region of the island semiconductor layer for forming a source region or a drain region of the n-channel TFT of the driver circuit and the pixel TFT; forming a fourth concentration p-type impurity region in a selected region of the island-like semiconductor layer for forming a source region or a drain region of the p-channel TFT of the driver circuit; forming a protective insulating film made of an inorganic insulating material over a gate electrode of the n-channel TFT of the driver circuit, the pixel TFT, and the p-channel TFT; forming an interlayer insulating film made of an organic insulating material in contact with the protection insulating film; a step of forming a conductive metal wiring to be connected to the pixel TFT via an opening provided in the interlayer insulating film and the protection insulating film; and forming a pixel electrode, on the interlayer insulating film, made from a transparent conductive film to be connected to the conductive metal wiring, and the other substrate is formed by at least a step comprising forming a transparent conductive film; and that the method comprises a step of sticking the one substrate and the other substrate together via at least one of the column-shape spacers formed overlapping the opening.

In the above method of manufacturing a semiconductor device, it is further possible to perform the step of forming a fourth concentration p-type impurity region in a selected region of the island semiconductor layer which forms a source region or a drain region of the p-channel TFT, after the step of forming the protective insulating film made of an inorganic insulating material over the gate electrode of a p-channel TFT of the driver circuit, to thereby form an off-set region between the channel forming region of the p-channel TFT and the fourth concentration p-type impurity region which forms a source region or a drain region.

In the above method of manufacturing a semiconductor device, it is characterized by further comprising the steps of: forming a gate electrode of the pixel TFT and the p-channel TFT and the n-channel TFT in the periphery of the pixel portion from a heat-resistant conductive material; and forming a gate wiring from a low-resistant conductive material, extending from the driver circuit to be connected to the gate electrode. Preferably the heat-resistant conductive material is formed from an element selected from the group consisting of tantalum (Ta), titanium (Ti), molybdenum (Mo), and tungsten (W); or a compound containing the above elements; or a compound of a combination of the above elements; or a nitride compound containing the above elements; or a silicide containing the above elements.

Still further, in the above method of manufacturing a semiconductor device, it is characterized in that the columnar spacer is also formed on the p-channel TFT and the n-channel TFT of the driver circuit, and that the column-shape spacer is formed at least covering the source wiring or the drain wiring of the p-channel TFT and the n-channel TFT of the driver circuit

BRIEF DESCRIPTION OF THE DRAWINGS

FIG. 1A to 1F are cross-sectional views showing manufacturing steps of a pixel TFT and TFTs of a driving circuit;

FIG. 3A to 3E are cross-sectional views showing manufacturing steps of a pixel TFT and TFTs of a driving circuit;

FIG. 4A to 4 C are cross-sectional views showing manufacturing steps of a pixel TFT and TFTs of a driving circuit;

FIG. 22A to 22F are diagrams showing an example of the semiconductor devices.

DESCRIPTION OF THE PREFERRED EMBODIMENTS

Figure 2A:
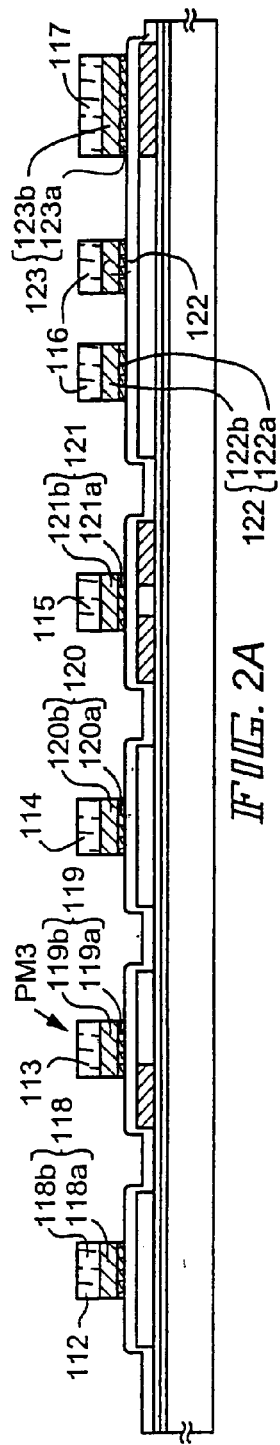
FIG. 2A to 2D are cross-sectional views showing manufacturing steps of a pixel TFT and TFTs of a driving circuit.

Hereinafter, preferred embodiments of the present invention will be explained in detail.

Embodiment 1

An embodiment of the present invention will be explained with reference to FIGS. 1A to 3F. In this embodiment, a method of forming simultaneously pixel TFTs and storage capacitors of a pixel section and TFTs of a driving circuit disposed in the periphery of the display region will be explained step-wise in detail.

In FIG. 1A, as well as barium borosilicate glass or aluminoborosilicate glass as typified by Corning #7059 glass and #1737 glass, plastic substrates which do not have optical anisotropy such as polyethylene terephthalate (PET), polyethylene naphthalate (PEN), polyethersulfone (PES), etc, can be used as the substrate 101. When the glass substrate is used, the substrate may be heat-treated in advance at a temperature lower by about 10 to 20° C. than a glass strain point. A base film 102 of a silicon oxide film, a silicon nitride film or a silicon oxynitride film, etc. is formed on the surface of the substrate 101, on which TFT is to be formed, in order to prevent the diffusion of impurities from the substrate 101. For example, the silicon oxynitride film 102a is formed from $SiH_4$, $NH_3$ and $N_2O$ to a thickness of 10 to 200 nm (preferably, 50 to 100 nm) by plasma CVD, and a hydrogenated silicon oxynitride film 102b is similarly formed from $SiH_4$ and $N_2O$ to a thickness of 50 to 200 nm (preferably, 100 to 150 nm) in lamination.

The silicon oxynitride film is formed by using the conventional parallel plate type plasma-enhanced CVD. The silicon oxynitride film 102a is formed by introducing $SiH_4$ at 10 sccm, $NH_3$ at 100 sccm and $N_2O$ at 20 sccm into a reaction chamber under the condition of a substrate temperature of 325° C., a reaction pressure of 40 Pa, a discharge power density of 0.41 W/cm$^2$ and a discharge frequency of 60 MHz. On the other hand, the silicon oxynitride film 102b is formed by introducing $SiH_4$ at 5 sccm, $N_2O$ at 120 sccm and $H_2$ at 125 sccm into a reaction chamber under the condition of a substrate temperature of 400° C., a reaction pressure of 20 Pa, a discharge power density of 0.41 W/cm$^2$ and a discharge frequency of 60 MHz. These films can be formed by only changing the substrate temperature and by switching the reactive gases.

The silicon oxynitride film 102a thus formed has a density of $9.28 \times 10^{22}/cm^3$, has an etching rate of about 63 nm/min in a mixed solution ("LAL500", a product of Stella Chemifa Co.) containing 7.13% of ammonium hydrogenfluoride ($NH_4HF_2$) and 15.4% of ammonium fluoride at 20° C., and is a compact and hard film. When such a film is used for the base film, the diffusion of alkali metal elements from the glass substrate into the semiconductor layers formed thereon can be effectively prevented.

Next, a semiconductor layer 103a having an amorphous structure is formed to a thickness of 25 to 80 nm (preferably, 30 to 60 nm) by a known method such as plasma CVD or sputtering. For example, the amorphous silicon film is formed to a thickness of 55 nm by plasma CVD. Semiconductor films having such an amorphous structure include an amorphous semiconductor film and a micro-crystalline semiconductor film, and a compound semiconductor film having an amorphous structure such as an amorphous silicon-germanium film may also be used. It is possible to continuously form the base film 102 and amorphous semiconductor layer 103a. For example, after the silicon oxynitride film 102a and the hydrogenated silicon oxynitride film 102b are formed continuously by plasma CVD as described above, the film formation can be carried out continuously by switching the reactive gases from $SiH_4$, $N_2O$ and $H_2$ to $SiH_4$ and $H_2$, or $SiH_4$ alone, without exposing them once to the atmosphere of the open air. As a result, the contamination of the surface of the hydrogenated silicon oxynitride film 102b can be prevented, and variance of the characteristics of the TFT to be fabricated and fluctuation of the threshold voltage can be reduced.

The crystallization step is then carried out to form a crystalline semiconductor layer 103b from the amorphous semiconductor layer 103a. A laser annealing method, a thermal annealing method (solid phase growth method) or a rapid thermal annealing (RTA) method can be used for this method. It is preferable to employ the laser annealing method when the glass substrate or the plastic substrate having a low heat resistance as described above is used. The RTA method uses an IR lamp, a halogen lamp, a metal halide lamp or a xenon lamp as the light source. Alternatively, the crystalline semiconductor layer 103b can be formed by the crystallization method using a catalytic element in accordance with the technology disclosed in Japanese Patent Application Laid-Open No. 7-130652. In the crystallization step, hydrogen contained in the amorphous semiconductor layer is first discharged preferably. It is good to perform the crystallization step after heat-treatment is conducted at 400 to 500° C. for about 1 hour to lower the hydrogen content to 5 atom % or below, because roughness of the film surface can be prevented advantageously.

When the crystallization step is conducted by the laser annealing method, a pulse oscillation type or continuous light emission type excimer laser, or an argon laser is used as the light source. When the pulse oscillation type excimer laser is used, the laser beam is processed to a linear shape and laser annealing is then conducted. The laser annealing condition can be selected appropriately by the operator. For example, the laser pulse oscillation is 30 Hz and the laser energy density is 100 to 500 mJ/cm$^2$ (typically, 300 to 400 mJ/cm$^2$). The linear beams are irradiated to the entire surface of the substrate, and the overlap ratio of the linear beams at this time is 80 to 98%. In this way, the crystalline semiconductor layer 103b can be obtained as shown in FIG. 1B.

A resist pattern is formed on the crystalline semiconductor layer 103b by photolithography that uses a photo-mask 1 (PM1) shown in FIG. 1C. The crystalline semiconductor layer is divided into an island shape by dry etching, forming thereby island semiconductor layers 104 to 108. A mixed gas of $CF_4$ and $O_2$ is used for dry etching. A mask layer 194 is then formed from a silicon oxide film having 50 to 100 nm thickness by plasma-enhanced CVD or sputtering.

An impurity for imparting the p-type may be applied in a concentration of about $1 \times 10^{16}$ to $5 \times 10^{17}$ atoms/cm$^3$ to the entire surface of the island semiconductor layers of this state to control the threshold voltage (Vth) of the TFTs. The elements of the Group XIII of the periodic table such as boron (B), aluminum (Al) or gallium (Ga) are known as the impurity elements for imparting p-type to the semiconductor. Ion implantation or ion doping is known as the method of doping these elements, but ion doping is suitable for processing a substrate having a large area. This ion doping method uses diborane ($B_2H_6$) as a source gas and adds boron (B). Addition of such an impurity element is not always necessary and may be omitted however, this is the method that can be used appropriately for keeping the threshold voltage of specifically the n-channel TFT, within a predetermined range.

In order to form a LDD region of the n-channel TFT of the driver circuit, an impurity element that imparts n-type is selectively doped into island semiconductor layers 105 and 107. For this purpose, resist masks 195a to 195e are formed by utilizing a photo mask 2 (PM2). It is appropriate to use phosphorous (P) or arsenic (As) as the impurity element that imparts n type. Ion doping using phosphine ($PH_3$) is applied here for doping phosphorous (P). The phosphorous (P) concentration in the formed first concentration n-type impurity regions 196 and 197 is in the range of $2\times10^{16}$ to $5\times10^{19}$ atoms/cm$^3$. Note that throughout the present specification, the concentration of the impurity element that imparts n-type contained in the impurity regions 196 and 197 formed here is indicated by (n$^-$). In addition, an impurity region 198, a semiconductor layer for forming a storage capacitor of the pixel portion, is also doped with phosphorous (P) at the same concentration. (See FIG. 1D)

The step of activating the doped impurity element is performed next. Activation can be performed by methods such as laser activation or heat treatment performed in a nitrogen atmosphere at 500° C. to 600° C. for 1 to 4 hours, or both methods may be used together. For the case of employing the laser activation method, the KrF excimer laser light (wavelength of 248 nm) is used to form a linear shape beam with the oscillating frequency set between 5 and 50 Hz, the energy density set between 100 and 500 mJ/cm$^2$ to scan at an overlapping ratio of between 80% and 98% to thereby treat the entire surface of the substrate on which the island-like semiconductor layer is formed. Note that there are no limitations placed on the irradiation conditions of the laser light, appropriate irradiation conditions may be determined by an operator. The mask layer 194 is removed by etching with a solution such as fluorine.

A gate insulating film 109 is formed from an insulating film containing silicon at a film thickness of between 40 and 150 nm by plasma CVD or sputtering. For example, it is appropriate to form the gate insulating film at a thickness of 120 nm from a silicon oxide nitride film. In addition, a silicon oxide nitride film made from $SiH_4$ and $N_2O$, both doped with $O_2$, is a favorable material for the application here because the fixed electric charge density has been reduced. The gate insulating film, of course, is not limited to such silicon oxide nitride film. A single layer or a laminated layer of other insulating films containing silicon may be used. (See FIG. 1F)

As shown in FIG. 1F, a heat-resistant conductive layer, for forming a gate electrode on the gate insulating film 109, is formed. The heat-resistant conductive layer may be formed as a single layer, or if necessary, it may have a laminated structure formed of a plurality of layers, such as 2 or 3 layers. Using such heat-resistant conductive materials, a lamination structure of, for example, a conductive layer (A) 110 formed from a conductive nitride metallic film and a conductive layer (B) 111 formed from a metallic film, is appropriate. The conductive layer (B) 111 may be formed from an element selected from the group consisting of tantalum (Ta), titanium (Ti), molybdenum (Mo), and tungsten (W); or an alloy having the above elements as its principal constituent; or an alloy film formed from a combination of the above elements (typically, an Mo—W alloy film and an Mo—Ta alloy film). The conductive layer (A) 110 is formed of elements such as tantalum nitride (TaN), tungsten nitride (WN), titanium nitride (TiN) film, and molybdenum nitride (MoN). Additionally, tungsten silicide, titanium silicide, and molybdenum silicide are also applicable for forming the conductive layer (A) 110. For the purpose of lowering the resistance of the conductive layer (B) 111, it is favorable to reduce the concentration of the impurity element contained therein, particularly in regards to the oxygen concentration, better at 30 ppm or less. For example, a resistivity of 20 μΩcm or less can be realized provided that the oxygen concentration of tungsten (W) is 30 ppm or less.

It is appropriate to form the conductive layer (A) 110 at a thickness of between 10 and 50 nm (preferably between 20 and 30 nm), and the conductive layer (B) 111 at a thickness of between 200 and 400 nm (preferably between 250 and 350 nm). For the case of using W as the gate electrode, a 50 nm thick conductive layer (A) 111 formed of tungsten nitride (WN) and a 250 nm thick conductive layer (B) 110 formed of W are formed by sputtering with W as the target and introducing argon (Ar) gas and nitrogen ($N_2$) gas. As another method, the W film may also be formed by thermal CVD using tungsten fluoride 6 ($WF_6$). In any case, it is necessary to lower the resistance of the W film for use as the gate electrode, the desired resistivity of the W film is 20 μΩcm or less. Growing larger crystal grains in the W film can lower the resistivity. However, crystallization is impeded when many impurity elements exist in the W, such as oxygen, then the W film become high resistance. Because of this, a W target having 99.9999% degree of purity is utilized for the case of sputtering, and furthermore, sufficient consideration must be made to prevent an impurity from the vapor from mixing into the films during film deposition. Accordingly, a resistivity of between 9 and 20 μΩcm can be realized.

On the contrary, for the case of using a TaN film as the conductive layer (A) 110 and a Ta film as the conductive layer (B) 111, similarly, both can be formed by sputtering. The TaN film, with Ta as the target, is formed by utilizing a gaseous mixture of Ar and nitrogen as the sputtering gas while only Ar is utilized as the sputtering gas for the Ta film. Further, the internal stress of the films to be formed may be relaxed by adding a moderate amount of Xe or Kr into the sputtering gas of these films to prevent the films from peeling. The resistivity of an α phase Ta film is about 20 μΩcm, and therefore it can be used as the gate electrode. Contrary to this, the resistivity of a β phase Ta film is about 180 μΩcm, and therefore it is unsuitable to be used as the gate electrode. Since the TaN film has a crystal structure close to the α phase, the α phase Ta film can be readily obtained by forming the Ta film on the TaN film. Although not shown in the figure, note that it is effective to form a phosphorous (P) doped silicon film at a thickness of between 2 and 20 nm under the conductive layer (A) 110. Due to this, the adhesion of the conductive film formed on the silicon film can be improved and averted from being oxidized, as well as preventing the very small amount of alkali metallic element contained in the conductive layer (A) 110 or the conductive layer (B) 111 from diffusing into the gate insulating film 109. Nevertheless, it is preferred that the conductive layer (B) 111 be formed within the resistivity range of between 10 and 50 μΩcm.

With employment of the photomask 3 (PM3), resist masks 112 through 117 are formed next by utilizing the photolithography technique. Then the conductive layer (A) 110 and the conductive layer (B) 111 are etched together to form gate electrodes 118 through 122 and a condenser wiring 123. The gate electrodes 118 through 122 and the condenser wiring 123 are integrally formed with layers 118a to 122a, formed of the conductive layer (A) 110, and with layers 118b to 122b, formed of the conductive layer (B) 111. (See FIG. 2A)

A method of etching the conductive layer (A) and the conductive layer (B) may be appropriately selected by the operator. As stated above, if the conductive layers are formed of a material having W as its principal constituent, it is desired that the dry etching method using high-density plasma be applied for implementing a speedy and precise etching. As one means of attaining high-density plasma, it is appropriate to employ the ICP (Inductively Coupled Plasma) etching device. In the etching method of W employing the ICP etching device, two types of gas, $CF_4$ and $Cl_2$ are introduced into the reaction chamber as etching gas, pressure is set between 0.5 and 1.5 Pa (preferably 1 Pa), and a high frequency electric power (13.56 MHz) of between 200 and 1000 W is applied to the inductively coupled portion. At this point, a 20 W high frequency electric power is applied to the stage with a substrate disposed therein. Due to charging a negative electric potential by self-bias, a positive ion is accelerated to thereby perform anisotropy etching. With employment of the ICP etching device, an etching speed of between 2 and 5 nm/sec can be achieved even in a hard metallic film such as W. In order to perform etching without leaving any residues, the etching time may be increased by about 10% to 20% to perform over-etching. However, attention must be paid to the selective ratio of etching with the base layer at this point. For example, the selective ratios of the oxidized silicon nitride film (the gate insulating film 109) to the W film is between 2.5 and 3. Due to such over-etching treatment, the exposed surface of the oxidized silicon nitride film is etched about 20 to 50 nm, substantially making the film become thinner.

Figure 2B:
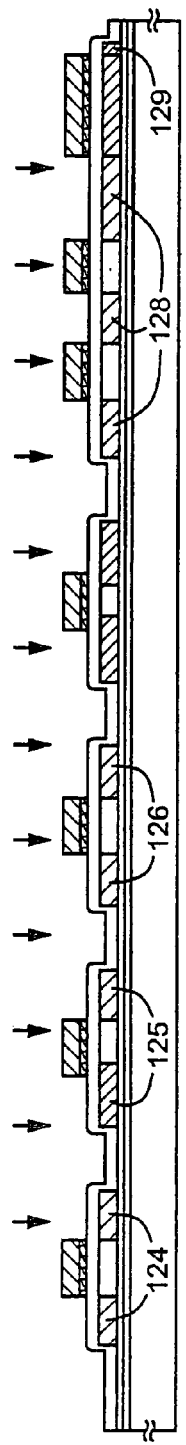
Figure 2C:
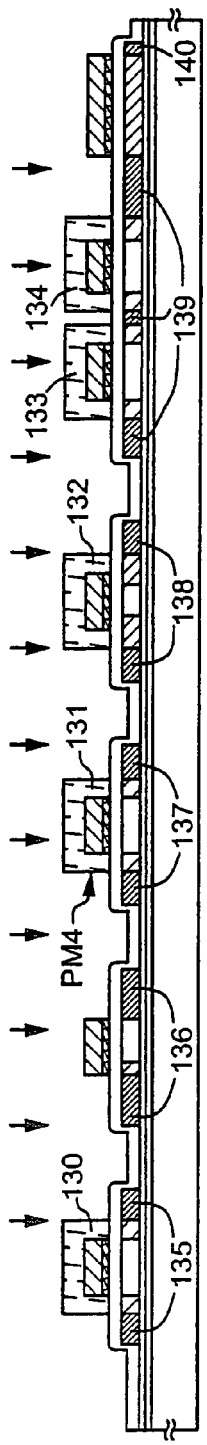
Figure 2D:
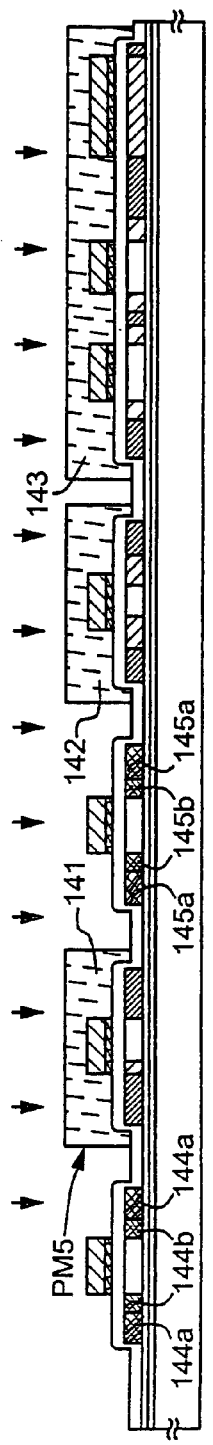

The step of doping an impurity element that imparts n type (n⁻ doping step) is performed next to form an LDD region in the n-channel TFT of the pixel TFT. Using the gate electrodes 118 through 122 as a mask, the impurity element that imparts n type is doped by ion doping in a self-aligning manner. The concentration of phosphorous (P), as the impurity element imparting n type, is doped at a concentration range from $1\times10^{16}$ to $5\times10^{19}$ atoms/cm³. Second concentration n-type impurity regions 124 to 129 are thus formed in the island-like semiconductor layer as shown in FIG. 2B.

The step of forming a third concentration n-type impurity region (n⁺ doping step) to function as a source region or a drain region in the n-channel TFT is performed next. First, resist masks 130 through 134 are formed by using the photomask 4 (PM4), then an impurity element that imparts n type is doped to thereby form the third concentration n-type impurity regions 135 through 140. Phosphorous (P) is used as the impurity element imparting n type. Ion doping using phosphine ($PH_3$) is performed so that the concentration of phosphorous will be in the concentration range from $1\times10^{20}$ to $1\times10^{21}$ atoms/cm³. (See FIG. 2C)

Next, fourth concentration p-type impurity regions 144 and 145 are formed as a source region or a drain region in the island-like semiconductor layers 104 and 106 that form the p-channel TFT. Using the gate electrodes 118 and 120 as masks, an impurity element that imparts p type is doped to thereby form the fourth concentration p-type impurity region in a self-aligning manner. At this point, the island-like semiconductor films 105, 107, and 108, which form the n-channel TFT, covers the entire surface of resist masks 141 through 143 formed by using the photomask 5 (PM5). Fourth concentration p-type impurity regions 144 and 145 are formed by ion doping using diborane ($B_2H_6$). The boron (B) concentration in this region is set to be between $3\times10^{20}$ and $3\times10^{21}$ atoms/cm³. (See FIG. 2D) In a previous step, phosphorous has been doped into the fourth concentration p-type impurity regions 144 and 145. Accordingly, the fourth concentration p-type impurity regions 144a and 145a has a concentration of between $1\times10^{20}$ and $1\times10^{21}$ atoms/cm³ and the fourth concentration p-type impurity regions 144b and 145b has a concentration of between $1\times10^{16}$ and $5\times10^{19}$ atoms/cm³. By doping boron (B) at a concentration of 1.5 to 3 times that of phosphorous in this step, there are no problems whatsoever as to the fourth concentration p-type impurity regions 144b and 145b functioning as a source region and a drain region of the p-channel TFT.

Figure 3A:
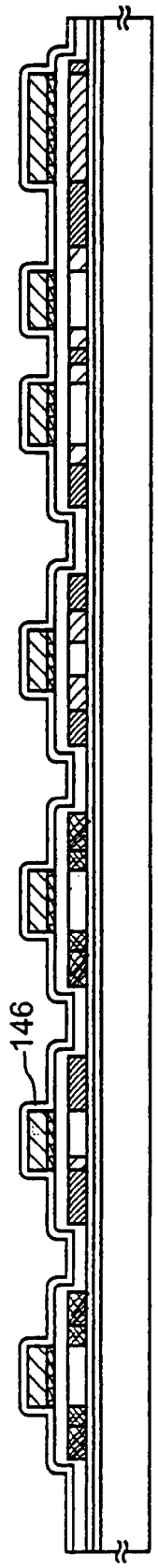

Thereafter, as shown in FIG. 3A, a protective insulating film 146 is formed from above the gate electrode and the gate insulating film. The protective insulating film may comprise a silicon oxide film, a silicon oxynitride film, a silicon nitride film or a laminate film of the combination of these films. In any case, the protective insulating film 146 is formed of an inorganic insulating material. The protective insulating film 146 has a film thickness of 100 to 200 nm. When the silicon oxide film is used, the film may be formed by plasma CVD, mixing tetraethyl orthosilicate (TEOS) and $O_2$, and setting the reaction pressure at 40 Pa, the substrate temperature of 300 to 400° C. and discharging at a high frequency (13.56 MHz) power density of 0.5 to 0.8 W/cm². When the silicon oxynitride film is used, a silicon oxynitride film formed from $SiH_4$, $NH_3$ and $N_2O$ by plasma CVD or a silicon oxynitride film formed from $SiH_4$ and $N_2O$ by plasma CVD may be formed. The deposition condition in this case is the reaction pressure of 20 to 200 Pa, the substrate temperature of 300 to 400° C., and the high frequency (60 MHz) power density of 0.1 to 1.0 W/cm². The hydrogenated silicon oxynitride film formed from $SiH_4$, $N_2O$ and $H_2$ may be used, as well. The silicon nitride film can be formed similarly from $SiH_4$ and $NH_3$ by plasma CVD.

Figure 3B:
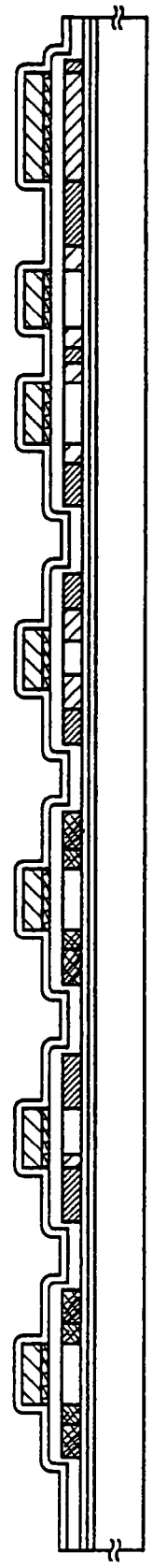

Thereafter, the step for activating the impurity elements imparting n-type or p-type added in the respective concentrations is conducted. This step is conducted by a thermal annealing method using a furnace annealing oven. Besides the thermal annealing method, it is possible to employ a laser annealing method and a rapid thermal annealing method (RTA method). The thermal annealing method is conducted in a nitrogen atmosphere containing oxygen in a concentration of 1 ppm or below, preferably 0.1 ppm or below, at 400 to 700° C., typically 500 to 600° C. In this embodiment, the heat-treatment is conducted at 550° C. for 4 hours. When a plastic substrate having a low heat-resistant temperature is used for the substrate 101, the laser annealing method is preferably employed (FIG. 3B).

After the activation step, heat-treatment was further conducted in an atmosphere containing 3 to 100% at 300 to 450° C. for 1 to 12 hours to hydrogenate the island semiconductor films. This is the process step that terminates the dangling bonds of $10^{16}$ to $10^{18}$/cm³ in the island semiconductor film by hydrogen that is thermally excited. Plasma hydrogenation (using hydrogen that is excited by plasma) may be used as another means for hydrogenation.

After the activation and hydrogenation steps are completed, an interlayer insulating film 147 made of an organic insulating material is formed to a mean thickness of 1.0 to 2.0 µm. Examples of the organic resin materials are polyimide, acrylic, polyamide, polyimidamide, BCB (benzocyclobutene), and so forth. When polyimide of the type, that is thermally polymerized after being applied to the substrate, is used, the material is baked at 300° C. in a clean oven. When acrylic is used, a two-component type is used. After the main agent and the curing agent are mixed, the mixture is applied to the entire surface of the substrate by using a spinner. Preparatory heating is then conducted by using a hot plate at 80° C. for 60 seconds, and baking is then made in the clean oven at 250° C. for 60 minutes.

By forming the interlayer insulating film from the organic insulating material, its surface can be planarized satisfactorily. The organic resin materials have generally a low dielectric constant, and the parasitic capacitance can be reduced. However, since they are hygroscopic, they are not suitable for the protective film. Therefore, the organic insulating material must be used in combination with the silicon oxide film, the silicon oxide nitride film or the silicon nitride film formed as the protective insulating film 146 as in this embodiment.

Figure 3C:
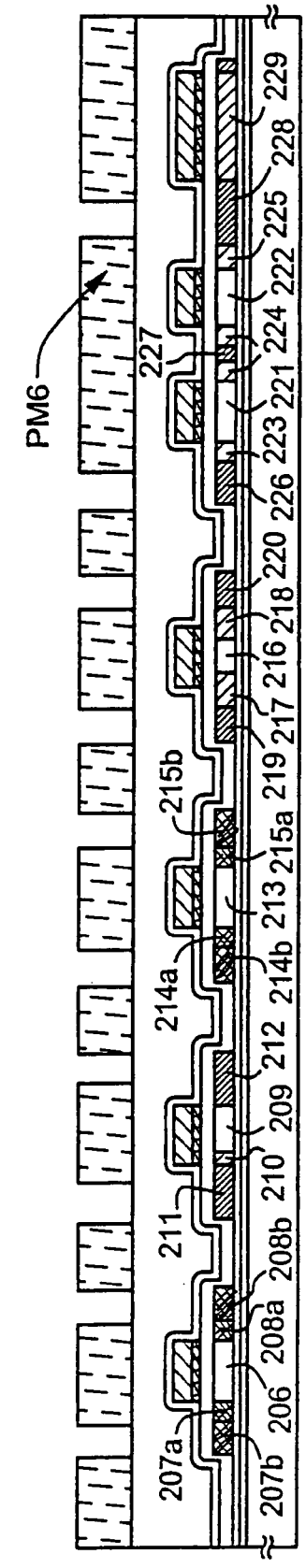

Thereafter, a resist mask having a prescribed pattern is formed by using a photo-mask 6 (PM6) shown in FIG. 3C, and contact holes reaching the source or drain regions of the respective island semiconductor films are formed. The contact holes are formed by dry etching. In this case, a mixed gas of $CF_4$, $O_2$ and He is used as the etching gas to first etch the interlayer insulating film formed of the organic resin material. The protective insulation film 146 is then etched with etching gases of $CF_4$ and $O_2$. By switching the etching gas further to $CHF_3$ to improve the selection ratio with the island semiconductor layers, the gate insulating film is etched and the contact holes can be formed satisfactorily.

A conductive metal film is formed by sputtering or vacuum deposition. A resist mask pattern is then formed by using a photo-mask 7 (PM7) shown in FIG. 3D. Source wirings 148 to 152 and drain wirings 153 to 158 are formed by etching. Here, the drain wiring 157 functions as the pixel electrode. Though not shown in the drawing, in this embodiment, Ti film is formed into 50 to 150 nm thickness, a contact is formed with the semiconductor film that forms source or drain region in the island semiconductor layer, and aluminum (Al) is formed to a thickness of 300 to 400 nm in superposition with the Ti film to give this wiring.

When the hydrogenation treatment is conducted under this state, favorable results can be obtained for the improvement of TFT performance. For example, the heat-treatment is conducted preferably at 300 to 450° C. for 1 to 12 hours in an atmosphere containing 3 to 100% of hydrogen. A similar effect can be obtained by using the plasma hydrogenation method. Such a heat-treatment can diffuse hydrogen existing in the protective insulating film 146 and the base film 102 into the island semiconductor films 104 to 108 and can hydrogenate these films. In any case, the defect density in the island semiconductor films 104 to 108 is lowered preferably to $10^{16}/cm^3$ or below, and for this purpose, hydrogen may be added in an amount of about 0.01 to about 0.1 atomic % (FIG. 3E).

Thus a substrate having the TFTs of the driving circuit and the pixel TFTs of the pixel section over the same substrate can be completed with 7 photo-masks. The first p-channel TFT 200, the first n-channel TFT 201, the second p-channel TFT 202 and the second n-channel TFT 203 are formed in the driving circuit. The pixel TFT 204 and the storage capacitance 205 are formed in the pixel section. In this specification, such a substrate will be referred to as an "active matrix substrate" for convenience sake.

The first p-channel TFT 200 in the driving circuit has a single drain structure, which has in the island semiconductor film 104: the channel formation region 206; and the source regions 207*a* and 207*b* and the drain regions 208*a* and 208*b* each comprising the p-type impurity region having the fourth concentration. The first n-channel TFT 201 has in the island semiconductor film 105: the channel forming region 209; the LDD region 210 that partly overlaps with the gate electrode 119 and comprises the impurity region having the first concentration; and the source region 212 and the drain region 211 comprising the impurity region having the third concentration. The LDD region that overlaps the gate electrode 119 is referred to as Lov here, and the length of this region in the direction of the channel length is 0.5 to 3.0 µm, preferably 1.0 to 2.0 µm. As the length of the LDD region in the n-channel TFT is determined in this way, a high electric field generated in the proximity of the drain region can be mitigated, and the occurrence of hot carriers and degradation of the TFT can be prevented. The second p-channel TFT 202 in the driving circuit has similarly the single drain structure including the channel forming region 213, the source regions 214*a* and 214*b* and the drain regions 215*a* and 215*b* comprising the p-type impurity region having the fourth concentration, in the island semiconductor film 106. A channel forming region 216; LDD regions 217 and 218 that partly overlap the gate electrode 121 and comprises the impurity region of the first concentration; and a source region 220 and a drain region 219 comprising the impurity region of the third concentration; are formed in the second n-channel TFT 203. The length of the Lov that partly overlaps the gate electrode of this TFT, too, is also set to 0.5 to 3.0 µm, preferably from 1.0 to 2.0 µm. Further, a LDD region that does not overlap the gate electrode is referred to as an Loff region, and its length in the channel length direction is 0.5 to 4.0 µm, preferably 1.0 to 2.0 µm. The pixel TFT 204 has in the island semiconductor film 108: channel forming regions 221 to 222; and LDD regions 223 to 225 comprising an impurity region of the second concentration; and source or drain regions 226 to 228 comprising an impurity region of the third concentration. The length of the LDD region (Loff) in the direction of the channel length is 0.5 to 4.0 µm, preferably 1.5 to 2.5 µm. Furthermore, a storage capacitance 205 comprises a capacitance wiring 123, an insulating film made of the same material as the gate insulating film and a semiconductor layer 229 that is connected to the drain region 228 of the pixel TFT 204. In FIG. 3F, the pixel TFT 204 is shown as having a double gate structure. However, it may have a single gate structure or a multi-gate structure having a plurality of gate electrodes.

Figure 16:
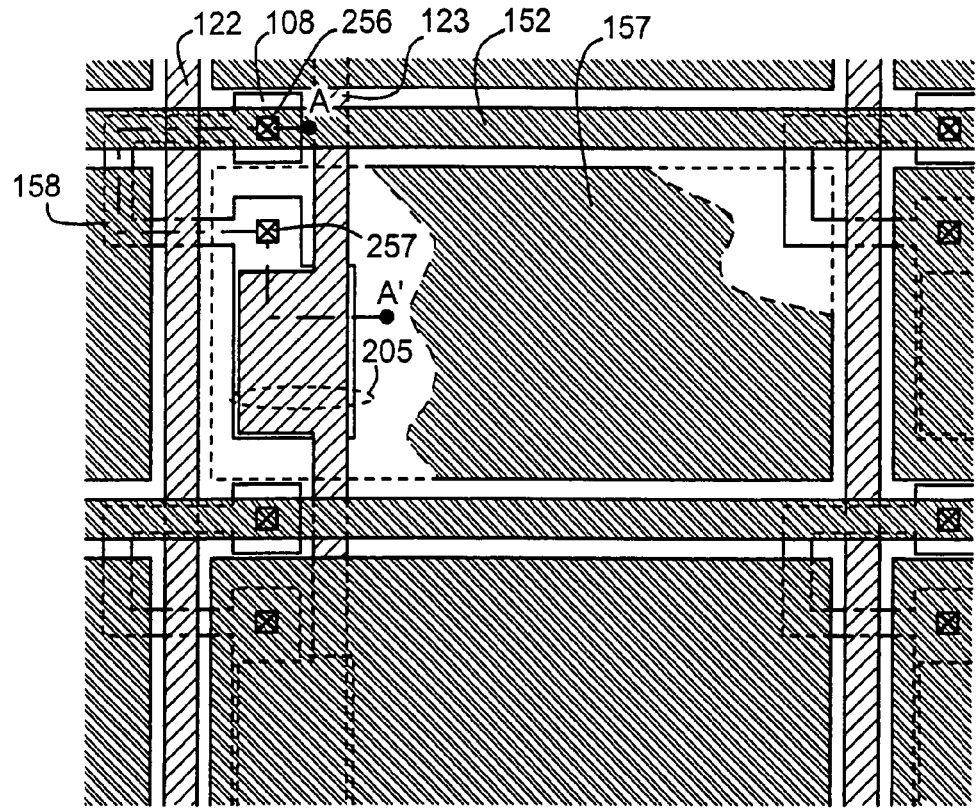
FIG. 16 is a top view showing the pixel of the pixel section.

FIG. 16 is a top view showing substantially one pixel of the pixel section. The cross section A-A' in the drawing corresponds to the sectional view of the pixel section shown in FIG. 3F. The gate electrode 122 of the pixel TFT 204, that functions also the gate wiring, intersects the island semiconductor layer 108 below it through a gate insulating film, which is not shown in the drawing. The source region, the drain region and the LDD region are formed in the island semiconductor layer, though they are not shown in the drawing. Reference numeral 256 denotes a contact portion between the source wiring 152 and the source region 226. Reference numeral 257 denotes a contact portion between the drain wiring 157 and the drain region 228. A storage capacitance 205 is formed by the overlapping region of the semiconductor layer 229 that extends from the drain region 228 of the pixel TFT 204 and a capacitance wiring 123 through the gate insulating film. In this construction, an impurity element for valency control is not added to the semiconductor layer 229.

The construction described above makes it possible to optimize the structure of the TFT constituting each circuit in accordance with the specification required by the pixel TFT and the driving circuit, and to improve operation performance and reliability of the semiconductor device. Furthermore, this construction makes it easy to activate the LDD region, the source region and the drain region by forming the gate electrode by a conductive material having heat resistance.

Embodiment 2

To accomplish a high-precision and high-quality liquid crystal display device, the characteristics of the TFT constituting the each circuit of the pixel TFT and the driving circuit must be improved. One of the required TFT characteristics is the decrease of the current flowing under the OFF state (OFF current) besides the threshold voltage, the field effect mobility, the sub-threshold coefficient (S value), and so forth. When the OFF current value is high, not only the power consumption increases, but also the operation characteristics of the driving circuit get deteriorated and may invite the drop of image quality. In the n-channel TFT fabricated in Embodiment 1, the LDD region is formed, and this LDD region can lower the OFF current value to the extent that renders no problem. On the other hand, since the p-channel TFT has the single drain structure, the increase of the OFF current value often becomes the problem. This embodiment provides a method of fabricating a p-channel TFT having an offset region suitable to cope with such a problem, by referring to FIG. 4A to 4C.

The process steps shown in FIGS. 1A to 2A are conducted first in the same way as in Embodiment 1, and the gate electrodes 118 to 122 and the capacitance wiring 123 are formed. Next, the step of adding the impurity element imparting n-type (n⁻ doping step) is conducted to form the LDD region in the n-channel TFT. Here, the impurity element imparting n-type is added by self-alignment using a gate electrodes. In this case, by using a photo-mask, the entire surface of island semiconductor layers 104 and 106, on which the p-channel TFT is to be formed, is covered with resist masks 158 and 159 so that the impurity element is not added to these areas. In this way, the n-type impurity regions 125 to 129 having the second concentration are formed in the island semiconductor layers as shown in FIG. 4A.

Next, in the n-channel TFT, an n-type impurity region having the third concentration that functions as the source or drain region is formed. Resist masks 130 to 134 are formed by using a photo-mask, and an impurity element imparting n-type is added to form n-type impurity regions 135 to 140 having the third concentration (FIG. 4B).

Thereafter, a protective insulating layer 146 is formed in the same way as in Embodiment 1. P-type impurity regions 144 and 145 having the fourth concentration to serve as the source and drain regions are formed in the island semiconductor layers 104 and 106 that constitute the p-channel TFT. Resist masks 160 to 162 are formed by using the photo-mask to cover the entire surface of the island semiconductor films 105, 107 and 108 that constitute the n-channel TFTs. This step is conducted by ion doping. The impurity element doped has slight fluctuation but is incident substantially vertically to the surface of the island semiconductor layers. The protective insulating layer 146 is formed with good coverage even at the end portion of the gate electrode. Therefore, the protective insulating layer formed at the end portion serves as a mask, and p-type impurity regions 144 and 145 having the fourth concentration are formed in the spaced-apart relation from the gate electrode by the distance corresponding to the film thickness of the protective insulating layer. In other words, offset regions 230 and 231 are formed to a length $L_O$ between the channel forming region and the p-type impurity region having the fourth concentration. More concretely, since the length $L_O$ corresponds to the thickness of the protective insulating layer 146, it is formed to a length of 100 to 200 nm.

Such an offset region contributes as a series resistance component to the electric characteristics of the TFT, and can reduce the OFF current value by about 1/10 to 1/100. Subsequently, the process steps from FIG. 3A are carried out in the same way as in Embodiment 1. An active matrix substrate can be completed by using seven photo-masks.

Embodiment 3

Embodiment 1 showed the example that uses the heat-resistant conductive material such as W and Ta for the gate electrode. The reason why such materials are used is because the impurity elements that are added mainly for valency control are activated by thermal annealing at 400 to 700° C. after the gate electrode is formed. However, such heat-resistant conductive material has the sheet resistivity of about 10Ω and are not suitable for a liquid crystal display device having a screen size of 4 inches or more. When the gate wiring connected to the gate electrode is made of the same material, the length of the lead wire on the substrate becomes essentially great, and the wiring delay resulting from the influence of the wiring resistance cannot be neglected.

When the pixel density is VGA, for example, 480 gate wirings and 640 source wirings are formed. When the pixel density is XGA, 768 gate wirings and 1,024 source wirings are formed. As for the screen size of the display region, the length of the diagonal is 340 mm in the case of the 13-inch class and 460 mm in the case of the 18-inch class. This embodiment explains the method of accomplishing such a liquid crystal display device by using low resistance conductive materials such as Al or Cu (copper) for the gate wirings with reference to FIGS. 5A to 5C.

First, the process steps shown in FIGS. 1A to 2D are conducted in the same way as in Embodiment 1. Next, the step for activating the impurity elements added to the respective island semiconductor layer for valency control is performed. This step is carried out by the thermal annealing method using the furnace annealing oven. The laser annealing method or the rapid thermal annealing method (RTA method) can be employed besides the thermal annealing method. This thermal annealing method is conducted in a nitrogen atmosphere having an oxygen concentration of 1 ppm or below, preferably 0.1 ppm or below, at 400 to 700° C., typically at 500 to 600° C. In this embodiment, the heat-treatment is conducted at 525° C. for 4 hours.

Figure 5A:
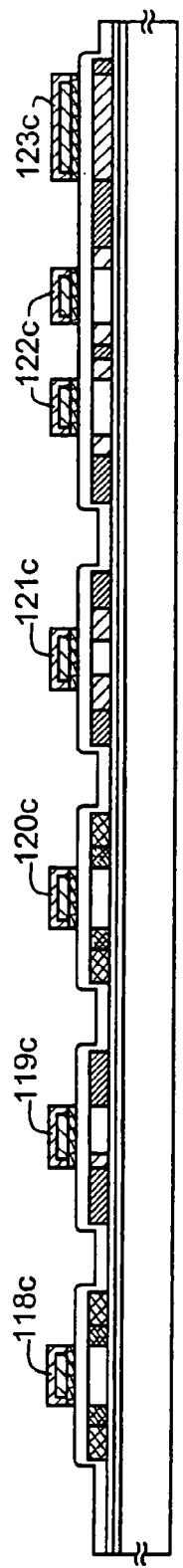
FIG. 5A to 5C are cross-sectional views showing manufacturing steps of a pixel TFT and TFTs of a driving circuit.

In this heat-treatment, conductive layers (C) 118c to 123c are formed to a thickness of 5 to 80 nm from the surface on the conductive layers (B) 118b to 123b forming the gate electrodes 118 to 122 and the capacitance wiring 123. When the conductive layers (B) 118b to 123b are made of tungsten (W), for example, tungsten nitride (WN) is formed and when they are made of tantalum (Ta), tantalum nitride (TaN) is formed. The conductor layers (C) 118c to 123c can be formed similarly by exposing the gate electrodes 118 to 123 to a plasma atmosphere containing nitrogen, such as nitrogen or ammonia. The heat-treatment is carried out further in an atmosphere containing 3 to 100% hydrogen at 300 to 450° C. for 1 to 12 hours to hydrogenate the island semiconductor layers. This process step is the one that terminates the dangling bonds of the semiconductor layers by thermally excited hydrogen. Plasma hydrogenation (using hydrogen excited by plasma) may be used as another hydrogenation means (FIG. 5A).

Figure 5B:
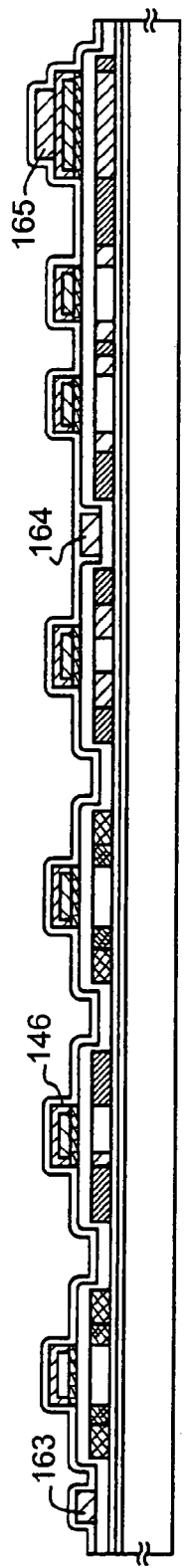
Figure 5C:
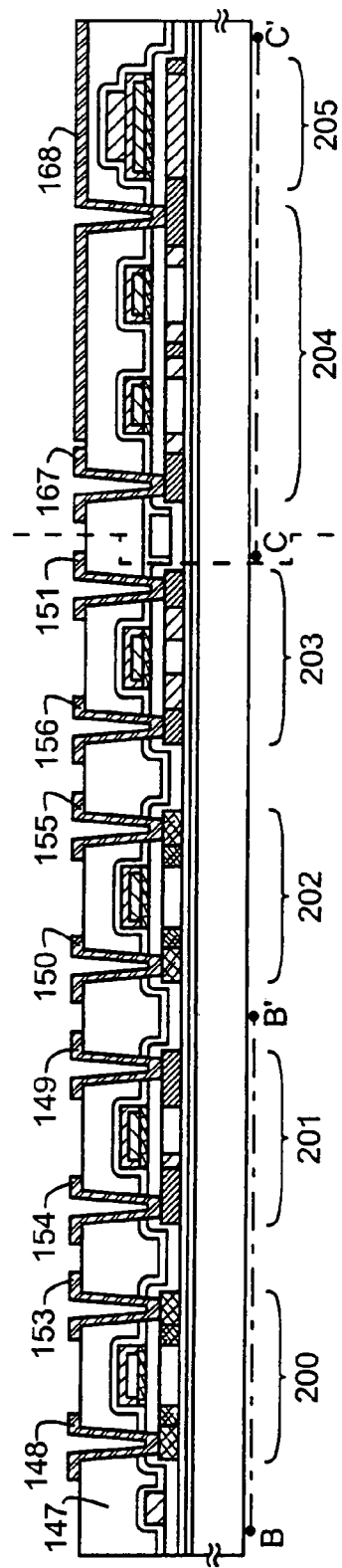

After the activation and hydrogenation steps are completed, the gate wirings are made of the low resistance conductive material. The low resistance conductive layer is formed of a conductive layer (D) containing Al or Cu as the principal component. For example, an Al film containing 0.1 to 2 wt % of Ti is formed as the conductor layer (D) on the entire surface (not shown in the drawing). The thickness of the conductive layer (D) 145 is 200 to 400 nm (preferably, 250 to 350 nm). Predetermined resist patterns are formed using a photo-mask and etching is conducted to form the gate wirings 163 and 164 and the capacitance wiring 165. This etching is made by wet etching using a phosphoric acid type etching solution and removes the conductor layer (D). In this way, the gate lead wires can be formed while keeping selective workability with the base films. A protective insulating film 146 is then formed (FIG. 5B).

Figure 6A:
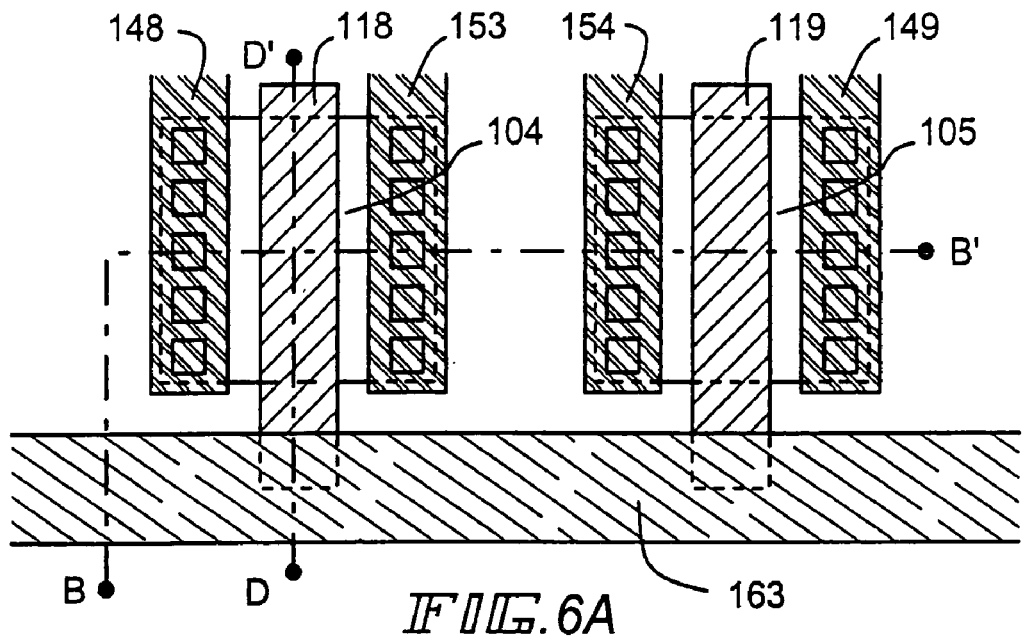
FIGS. 6A and 6B are a top views showing the construction of the TFT of the driving circuit and the pixel TFT.
Figure 6B:
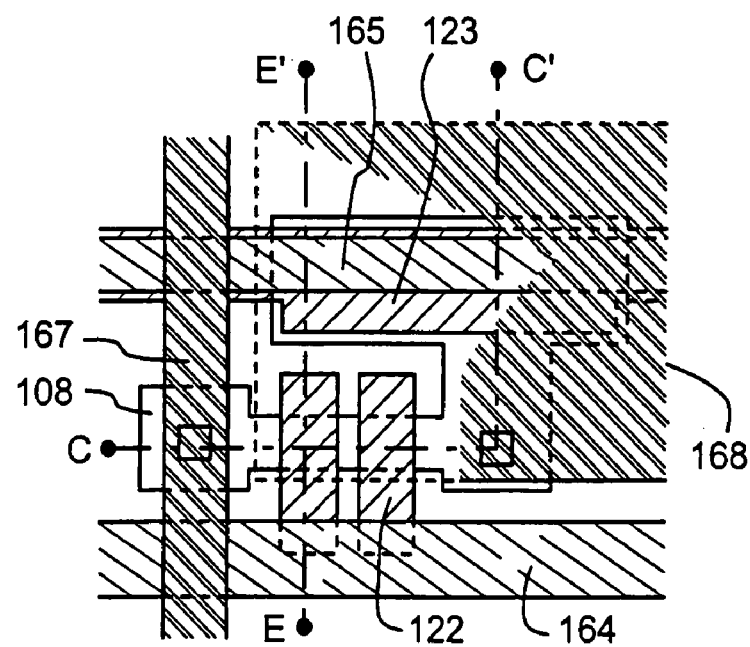
Figure 7A:
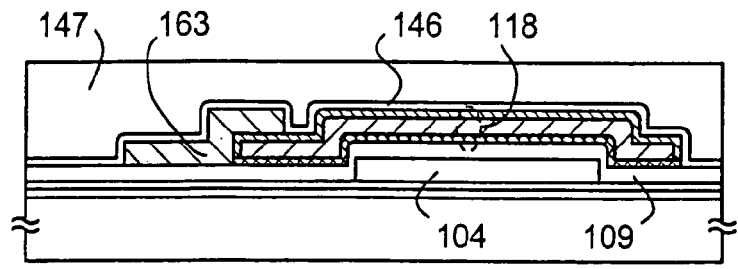
FIGS. 7A and 7B are cross-sectional views showing manufacturing steps of a pixel TFT and TFTs of a driving circuit.
Figure 7B:
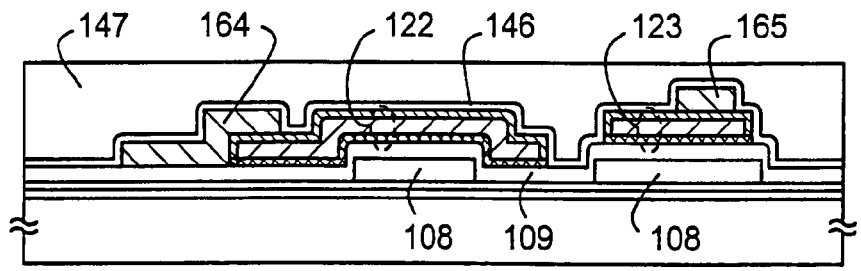

An interlayer insulating film 147 made of an organic insulating material, source wirings 148 to 151 and 167 and drain wirings 153 to 156 and 168 are formed in the same way as in Embodiment 1. An active matrix substrate can be thus completed. FIGS. 6A and 6B are top views of this state. The B-B' section of FIG. 6A and the C-C' section of FIG. 6B correspond to A-A' and C-C' of FIG. 5C, respectively. The gate insulating film, the protective insulating film and the interlayer insulating film are omitted in FIGS. 6A and 6B. However, the source wirings 148, 149 and 167 and the drain wirings 153, 154 and 168 are connected to the source and drain regions, not shown, of the island semiconductor layers 104, 105 and 108 through contact holes. The D-D' section of FIG. 6A and the E-E' section of FIG. 6B are shown in FIGS. 7A and 7B, respectively. The gate wiring 163 and 164 are formed in such a fashion that the former 163 overlaps with the gate electrodes 118 and 119 and the latter 164, with the gate electrode 122, outside the island semiconductor layers 104, 105 and 108, respectively. The conductor layer (C) and the conductor layer (D) are in contact, and connected electrically. In this way, the wiring resistance can be lowered sufficiently by forming the gate wiring from the low resistance conductive material. Therefore, this embodiment can be applied to the display device having the pixel section (screen size) of the 4-inch class or larger.

Embodiment 4

The active matrix substrate fabricated in Embodiment 1 can be applied to a reflection type liquid crystal display device. When it is applied to a transmission type liquid crystal display device on the other hand, the pixel electrode provided to each pixel of the pixel section may be formed of the transparent electrode. In this embodiment, a method of fabricating the active matrix substrate adapted to the transmission type liquid crystal display device will be explained with reference to FIGS. 10A and 10B.

Figure 10A:
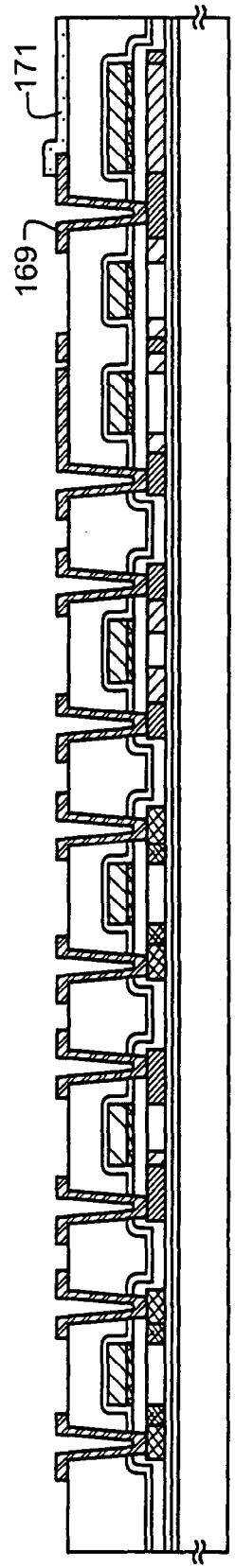
FIGS. 10A and 10B are cross-sectional views showing manufacturing steps of a pixel TFT and TFTs of a driving circuit.

The active matrix substrate is manufactured in the same way as in Embodiment 1. In FIG. 10A, the source wiring and the drain wiring are formed from a conductive metal film by sputtering or vacuum evaporation. A Ti film is formed to a thickness of 50 to 150 nm and a contact is formed with the semiconductor films that form the source or drain region in the island semiconductor layer. Aluminum (Al) is formed to a thickness of 300 to 400 nm in superposition with the Ti film. Furthermore, a Ti film or a titanium nitride (TiN) film is formed to a thickness of 100 to 200 nm. In this way, a three-layered structure is completed. Thereafter, a transparent conductive film is formed on the entire surface, and pixel electrode 171 is formed by patterning treatment and etching treatment with a photo-mask. The pixel electrode 171 is formed on the interlayer insulating film 147, and a portion overlapping with the drain wiring 169 of each pixel TFT 204 is disposed to form a connection structure.

Figure 10B:
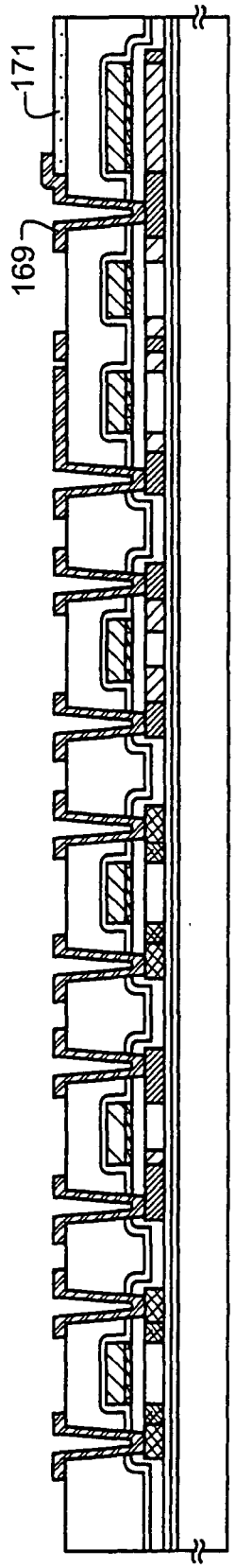

FIG. 10B is an example of first forming a transparent conductor film on the interlayer insulating film 147, forming the pixel electrode 171 through patterning treatment and etching treatment, and then forming drain wiring 169 to dispose portions that overlap the pixel electrode 171. The drain wiring 169 is disposed by: forming a Ti film to a thickness of 50 to 150 nm; forming contact with a semiconductor film which form the source or drain region in the island semiconductor layer; and forming aluminum (Al) to a thickness of 300 to 400 nm in superposition with the Ti film. According to this construction, the pixel electrode 171 comes into contact with only the Ti film that forms the drain wiring 169. As a result, the reaction between the transparent conductor film and Al can be prevented.

Indium oxide ($In_2O_3$) or an indium oxide-tin oxide alloy ($In_2O_3$—$SnO_2$; ITO) may be formed by sputtering or vacuum evaporation as the material of the transparent conductor film. Etching treatment of such a material is made by using a hydrochloric acid type solution. However, because the residue is likely to remain particularly in etching of ITO, indium oxide-zinc oxide alloy ($In_2O_3$—$ZnO$) may be used to improve the etching factor. The indium oxide-zinc oxide alloy is excellent in surface flatness and heat stability with respect to ITO. Therefore, this material can prevent the corrosive reaction with Al which comes into contact on the end face of the drain wiring 169. Similarly, zinc oxide ($ZnO$) is a suitable material, and further, zinc oxide added with gallium (Ga) (ZnO:Ga), for improving transmissivity of the visible rays and the electric conductivity can be used, too.

In this way, an active matrix substrate adaptable to the transmission type liquid crystal display device can be completed. Though this embodiment has been explained by using the same process steps as those of Embodiment 1, this construction can be applied to the active matrix substrate shown in Embodiment 2 and Embodiment 3.

Embodiment 5

This embodiment shows another method of fabricating the crystalline semiconductor layer for forming the active layer of the TFTs of the active matrix substrate described in Embodiments 1 through 4. The crystalline semiconductor layer is formed by crystallizing the amorphous semiconductor layer by thermal annealing, laser annealing or RTA, etc. In addition, the crystallization method using a catalytic element, that is disclosed in Japanese Patent Application Laid-Open No. 7-130652, can be applied. An example of this case will be explained with reference to FIGS. 8A to 8C.

Figure 8A:
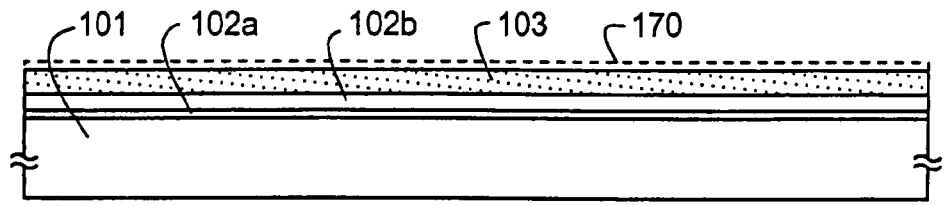
FIG. 8A to 8C are cross-sectional views showing manufacturing steps of a pixel TFT and TFTs of a driving circuit.

Base films 102a and 102b and an amorphous semiconductor layer 103a to a thickness of 25 to 80 nm are formed over a glass substrate 101 in the same way as in Embodiment 1, as shown in FIG. 8A. An amorphous silicon film, for example, is formed to a thickness of 55 nm. An aqueous solution containing 10 ppm, calculated by weight, of a catalytic element is applied by a spin coating method to form a layer 170 containing the catalytic element. Examples of the catalytic element include nickel (Ni), germanium (Ge), iron (Fe), palladium (Pd), tin (Sn), lead (Pb), cobalt (Co), platinum (Pt), copper (Cu) and gold (Au). Besides spin coating, the layer 170 containing the catalytic element may be formed by sputtering or vacuum evaporation so that the thickness of the layer of the catalytic element is 1 to 5 nm.

Figure 8B:
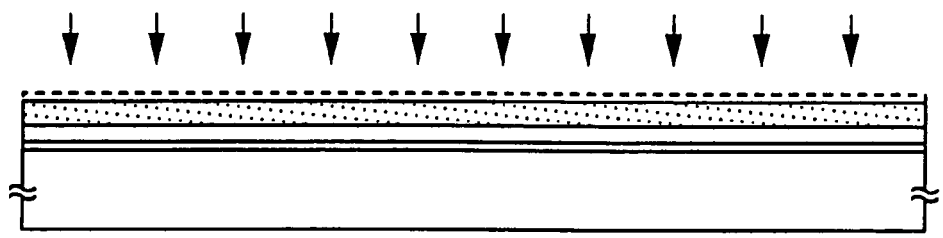
Figure 8C:
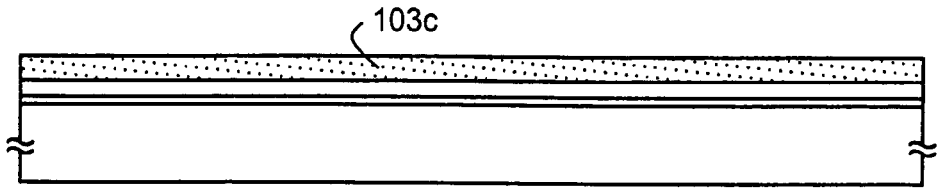

In the crystallization step shown in FIG. 8B, heat treatment is conducted first at 400 to 500° C. for about 1 hour and the hydrogen content of the amorphous silicon film is lowered to not greater than 5 atom %. Thermal annealing is then conducted in a nitrogen atmosphere at 550 to 600° C. for 1 to 8 hours by using a furnace annealing oven. This process step can acquire a crystalline silicon layer 103c comprising the crystalline silicon film (FIG. 8C). When the crystalline semiconductor layer 103c formed by heat annealing is observed macroscopically through an optical microscope in this case, however, amorphous regions are found sometimes remaining locally in the crystalline semiconductor layer 103c formed by this heat annealing, and amorphous components having a broad peak at 480 $cm^{-1}$ is observed by a Raman spectroscopy. Therefore, it is effective to process the crystalline semiconductor layer 103c by the laser annealing method after heat annealing in the same way as in Embodiment 1 to improve its crystallinity.

An active matrix substrate can be completed similarly to Embodiment 1 when island semiconductor layers 104 to 108 are manufactured from thus formed crystalline semiconductor film 103c. However, in case of using a catalyst element that promotes crystallization of silicon in the crystallization step, a trace amount (approximately $1 \times 10^{17}$ to $1 \times 10^{19}$ atoms/cm$^3$) of catalyst element remained in the island semiconductor layers. Though it is possible to complete TFTs in such a state, it was more preferable to remove the remained catalytic elements at least from the channel forming regions. There is a means using gettering effect by phosphorus (P) to remove the catalytic element.

Figure 9:
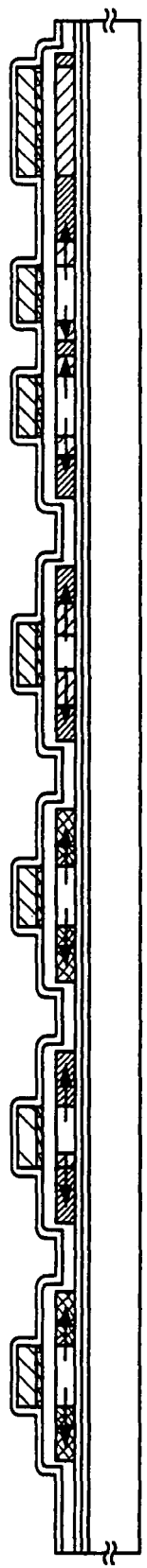
FIG. 9 is a cross-sectional view showing a manufacturing step of a pixel TFT and TFTs of a driving circuit.

A gettering treatment with phosphorus (P) for this purpose can be conducted simultaneously with the activation step explained in FIG. 3B. This process step is shown in FIG. 9. The concentration of phosphorus (P) necessary for gettering may be approximately the same as the impurity concentration of the n-type impurity region having the third concentration. Thermal annealing of the activation step can make the catalytic element to segregate from the channel formation region of the n-channel TFT and the p-channel TFT to the impurity region containing phosphorus (P) in that concentration (in the direction indicated by an arrow in FIG. 9). As a result, the catalytic element segregates in a concentration of $1 \times 10^{17}$ to $1 \times 10^{19}$ atoms/cm$^3$ in the impurity region. The TFT thus fabricated has a lowered OFF current value and has high crystallinity. Therefore, high field effect mobility can be obtained, and excellent characteristics can be accomplished.

Embodiment 6

Figure 13:
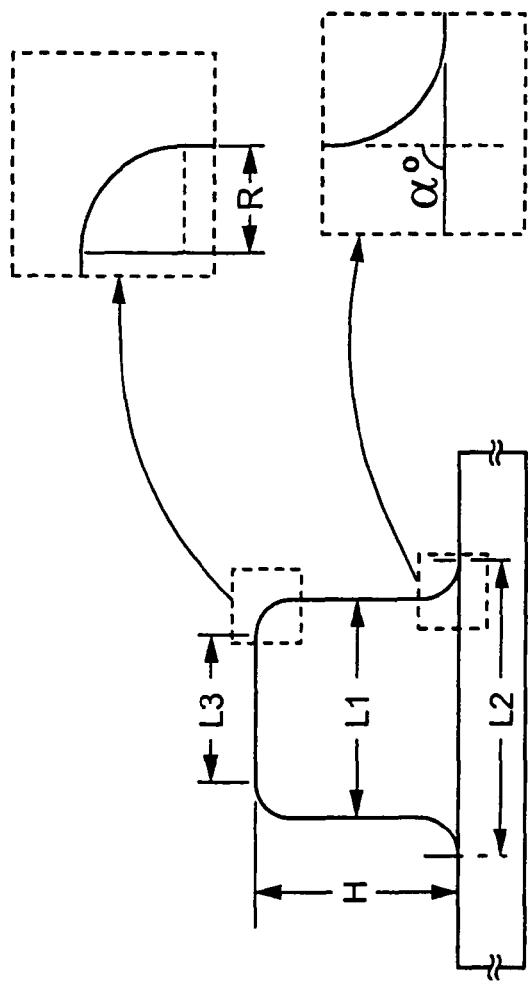
FIG. 13 is an explanatory view used for explaining the shape of a columnar spacer.

This embodiment explains the manufacturing steps of an active matrix liquid crystal display device from the active matrix substrate manufactured in Embodiment 1. First, as shown in FIG. 1A, a spacer comprising a columnar spacer is formed on the active matrix substrate under the state shown in FIG. 3C. The spacer may be formed by spraying of particles having a size of several microns. In this embodiment, however, a method of forming the spacers by forming a resin film over the entire surface of the substrate and then patterning, was adopted. The material of the spacer is not limited, in particular. For example they may be formed by using "NN700" of JSR Co., and after the material is coated by a spinner, a prescribed pattern is formed by exposure and development. The pattern is then heated and cured at 150 to 200° C. in a clean oven, or the like. The shape and size of the spacer can be changed depending on the conditions of exposure and development. Preferably, however, the columnar spacer 173 has a columnar shape with a flat top as shown in FIG. 13. When the substrate on the opposite side is put, the mechanical strength as the liquid crystal display panel can be secured. The shape is not particularly limited and may be conical or pyramidal. When it is conical, for example, the height H is 1.2 to 5 µm, the mean radius L1 is 5 to 7 µm and the ratio of the mean radius L1 to the radius L2 of the bottom is 1:1.5. The taper angle of the side surface is not greater than ±15° at this time.

Figure 11A:
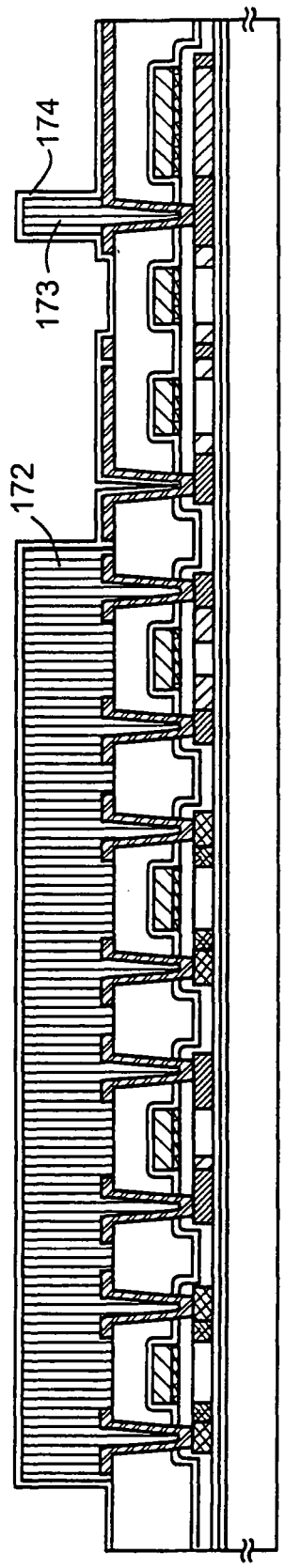
FIGS. 11A and 11B are cross-sectional views showing manufacturing steps of an active matrix liquid crystal display device.

The arrangement of the columnar spacer may be decided arbitrarily. Preferably, however, the columnar spacer 173 is disposed in such a manner as to be superposed with, and cover, the contact section of the drain wiring 168 (pixel electrode) in the pixel section as shown in FIG. 11A. Since planarity at the contact section is lost and the liquid crystal is not oriented well at this section, disclination, etc. can be prevented by forming the columnar spacer 173 in the form in which the spacer resin is filled to the contact section.

Thereafter, the alignment film 174 is formed. A polyimide resin is used generally for the alignment film of the liquid crystal display element. After the alignment film is formed, rubbing treatment is conducted so that the liquid crystal molecules are oriented with a certain pre-tilt angle. The region from the end portion of the columnar spacer 173 disposed in the pixel section to the region that is not rubbed, in the rubbing direction is not greater than 2 µm. The occurrence of static electricity often becomes the problem during the rubbing treatment. When the spacer 172 is formed over the TFT of the driving circuit, too, both original role as the spacer and the protection effect of the TFT from static electricity can be acquired.

Figure 11B:
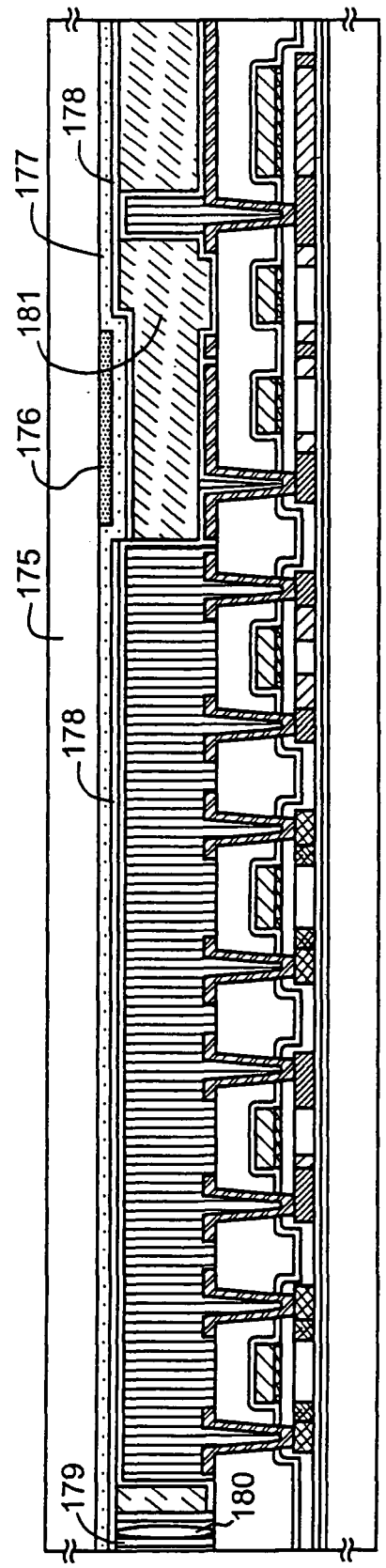

A shielding film 176, a transparent conductive film 177 and an alignment film 178 are formed on an opposing substrate 175 on the opposite side. Ti, Cr, Al or the like is formed to a thickness of 150 to 300 nm as the shielding film 176. The active matrix substrate on which the pixel section and the driving circuit are formed and the opposing substrate are bonded to each other through a sealant 179. A filler 180 is mixed in the sealant 179. These two substrates are bonded together while keeping a uniform gap by the filler 180 and the spacers 172 and 173. Thereafter, a liquid crystal material 606 is injected between both substrates, and the substrates are completely sealed by the sealant (not shown). A known liquid crystal material may be used for the liquid crystal material. In this way, the active matrix liquid crystal display device shown in FIG. 11B can be completed.

Figure 19:
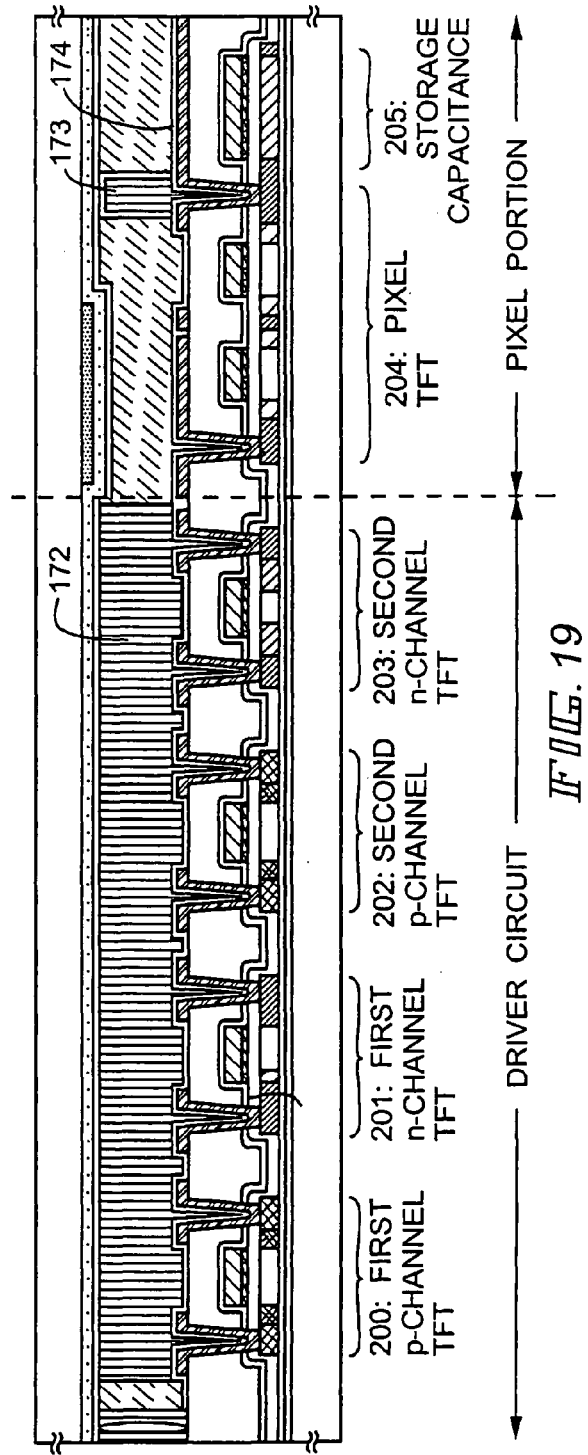
FIG. 19 is a cross-sectional view showing a manufacturing step of an active matrix type liquid crystal display device.

It is also possible to first form the alignment film 174 and then form the spacer, as shown in FIG. 19.

Figure 12:
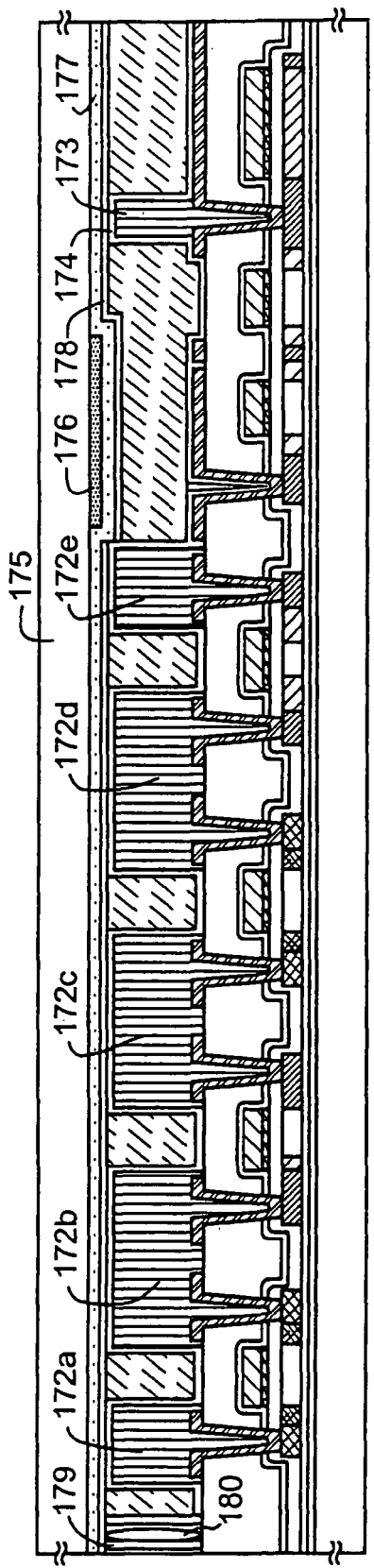
FIG. 12 is a cross-sectional view showing manufacturing step of an active matrix liquid crystal display device.

FIG. 11 shows the example where the spacer 172 is formed on the entire surface of the TFT of the driving circuit. However, the spacer may be divided into a plurality of spacers 172a to 172e as shown in FIG. 12. The spacer disposed at the area where the driving circuit are formed may formed in such a manner as to cover at least the source and drain wirings of the driving circuit. According to this construction, each TFT of the driving circuit is completely covered and protected by the protective insulating film 146, the interlayer insulating film 147 and the spacer 172 or the spacers 172a to 172e.

Figure 14:
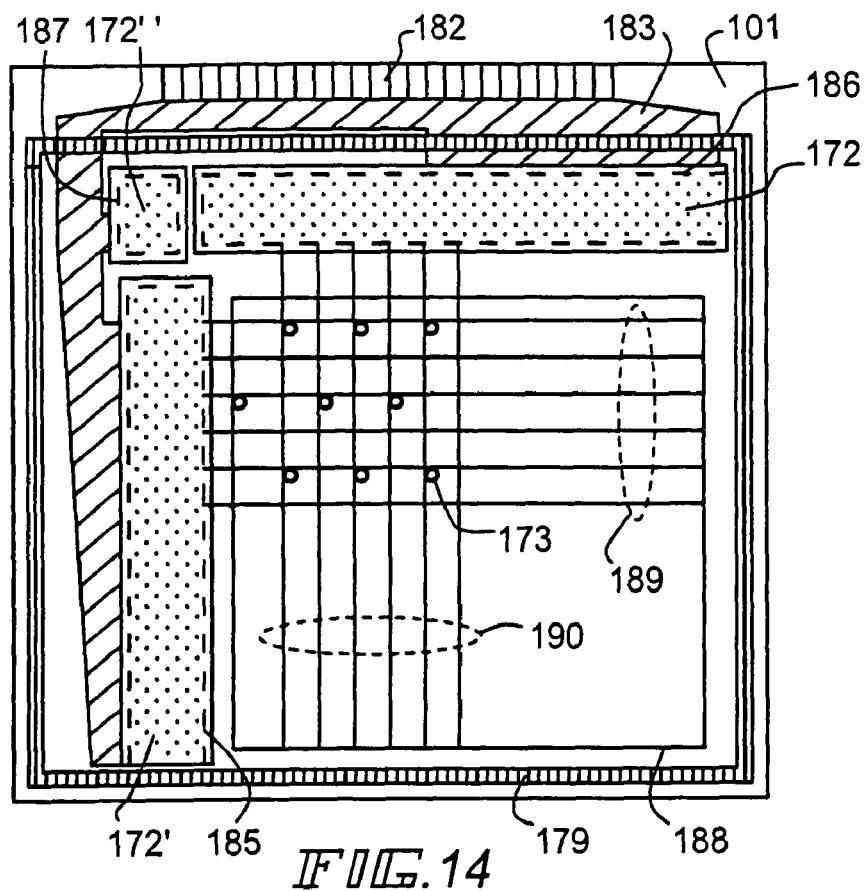
FIG. 14 is a top view useful for explaining the arrangement of input/output terminals, wires, circuit arrangement, spacers and sealants of a liquid crystal display device.

FIG. 14 is a top view of an active matrix substrate. It is the top view showing the positional relationship among the pixel section, the driving circuit section, the spacers and the sealant. A scanning signal driving circuit 185 and an image signal driving circuit 186 are disposed as the driving circuit in the peripheral of the pixel section 188. A signal processing circuit 187 such as a CPU, a memory, etc, may be further added. These driving circuits are connected to external input/output terminals 182 by connection wiring 183. In the pixel unit 188, a group of gate wirings 189 extending from the scanning signal driving circuit 185 and a group of source wirings 190 extending from the image signal driving circuit 186 cross one another in the matrix form. A pixel TFT 204 and a storage capacitance 205 are provided to each pixel.

The columnar spacer 173 disposed in the pixel section may be provided to all the pixels, or, they may be provided to every several or dozens of pixels disposed in matrix. In other words, the proportion of the number of spacers to the total number of pixels constituting the pixel unit may be preferably 20 to 100%. The spacers 172, 172' and 172" provided to the driving circuit section may be disposed in such a fashion as to cover the entire surface of the driving circuit section, or may be divided into several segments in match with the positions of the source and drain wirings of the TFT as shown in FIG. 12.

The sealant 179 is applied outside the pixel section 188, the scanning signal control circuit 185, the image signal control circuit 186 and other signal processing circuits 187 over the substrate 101, but inside the external input/output terminals 182.

Figure 15:
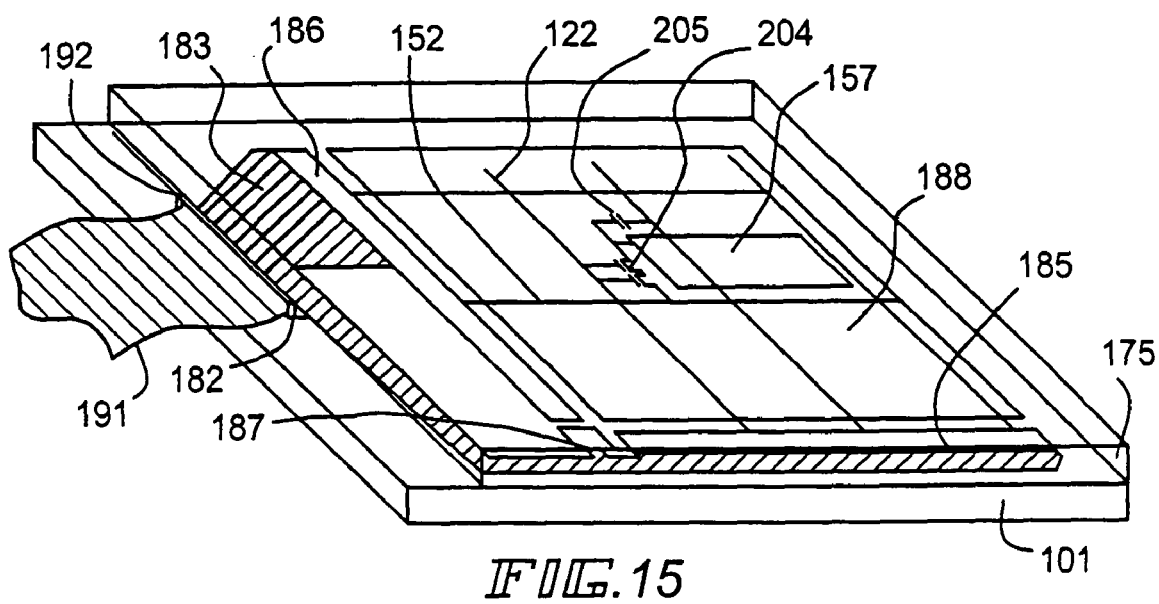
FIG. 15 is a perspective view showing the construction of the liquid crystal display device.

The construction of such an active matrix liquid crystal display device will be explained with reference to the perspective view of FIG. 15. In FIG. 15, the active matrix substrate comprises the pixel section 188, the scanning signal driving circuit 185, the image signal driving circuit 186 and other signal processing circuit 187 formed over the glass substrate 101. The pixel TFT 204 and the storage capacitance 205 are provided to the pixel section 188. The driving circuit disposed in the periphery of the pixel section comprises the CMOS circuit as the basic circuit. The scanning signal driving circuit 185 and the image signal driving circuit 186 are connected to the pixel TFT 204 by the gate wiring 122 and the source lead wiring 152. A flexible printed circuit (FPC) 191 is connected to the external input terminal 182 and is used for inputting the image signal, and the like. It is connected to the respective driving circuit by connection wiring 183. Though not shown in the figure, the shielding film and the transparent electrodes are disposed on the opposing substrate 175.

Figure 18:
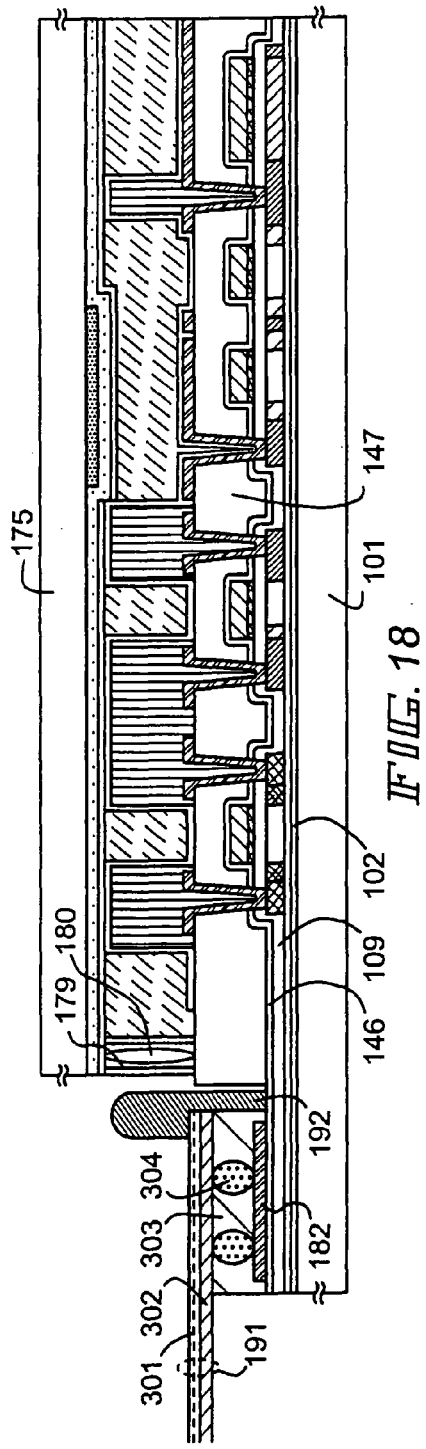
FIG. 18 is an explanatory view of the connection structure between a flexible printed circuit board and external input/output terminals.

FIG. 18 is an explanatory view used for explaining the connection structure between the external input/output terminal 182 and the FPC 191. The external input/output terminal 182 is formed from the conductive metal film in the same structure as the source wiring or the drain wiring, and is formed on the substrate 101 from which the interlayer insulating film 147 is removed. The FPC 191 has copper wirings 302 formed on the organic resin film 301 such as polyimide and is connected to the external input/output terminal 182 by an anisotropic conductive adhesive. The anisotropic conductive adhesive comprises an adhesive 303 and particles 304 that have a diameter of dozens to hundreds of microns, have a conductive surface plated with gold, or the like, and are mixed in the adhesive 303. When the particles 304 come into electric contact with the external input/output terminal 182 and with the copper wirings 302, the electric contact is established at such portions. The FPC 191 swells out from the external input/output terminals 182 and is bonded so as to improve the bonding strength with the substrate 101. It has a resin layer 192 at its end portion to improve the mechanical strength at this portion.

Figure 20:
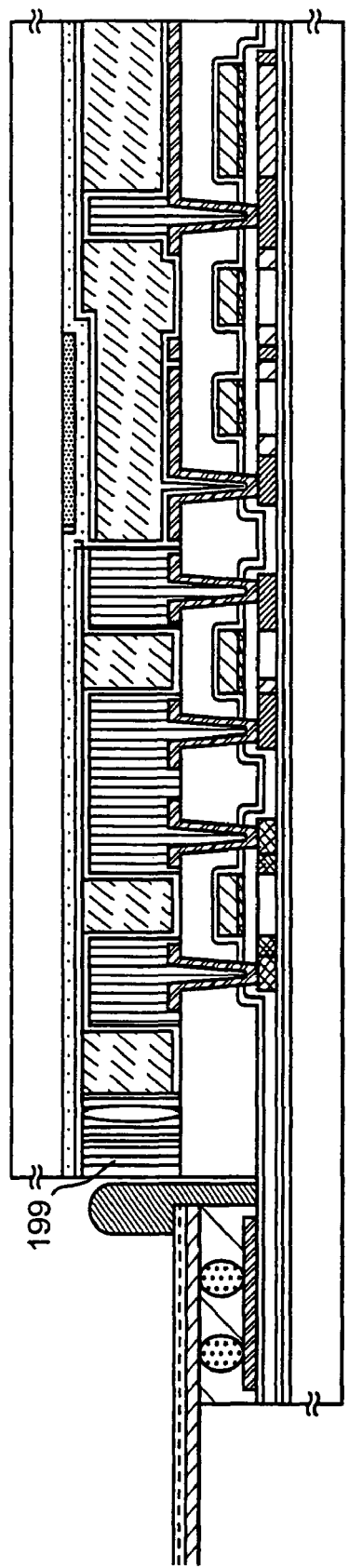
FIG. 20 is an explanatory view of the connection structure between the flexible printed board and the external input/output terminals.

Further, as shown in FIG. 20, when the connection structure of the external input/output terminals 182 and the FPC 191 are made the same, and the spacer 199 is further provided to the outside of the sealant 179 and clamped between the active matrix substrate and the opposing substrate, the mechanical strength at this portion can be increased. This construction functions particularly effectively when a part of the opposing substrate is cut off so as to expose the external input/output terminals 182.

The liquid crystal display device having such a construction can be fabricated by using the active matrix substrate explained in Embodiments 1 through 4. When the active matrix substrate of any of Embodiments 1 through 3 is used, a reflection type liquid crystal display device can be obtained. When the active matrix substrate shown in Embodiment 4 is used, a transmission type liquid crystal display device can be obtained.

Embodiment 7

Figure 17:
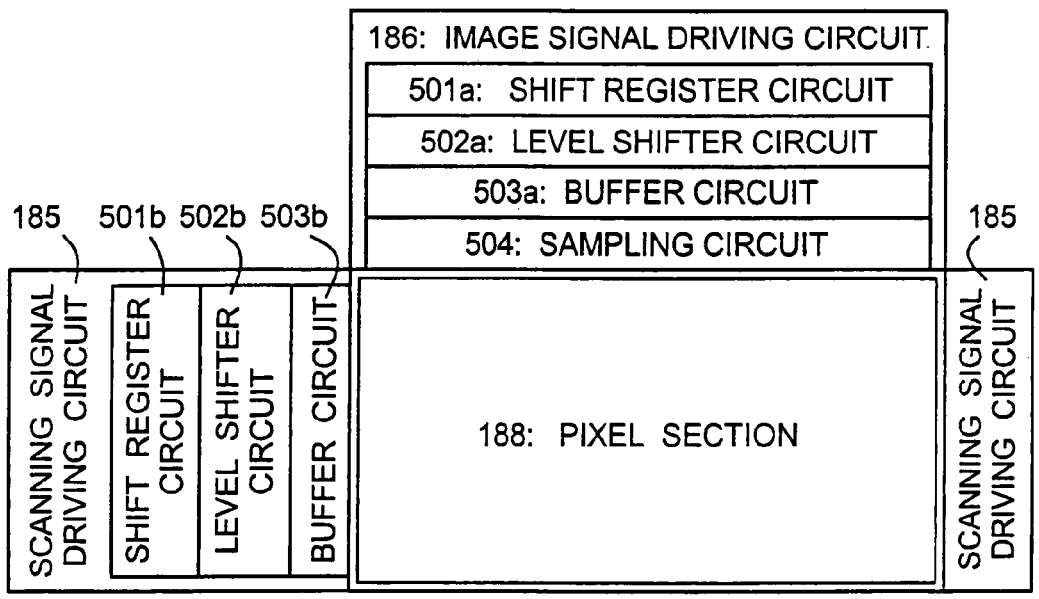
FIG. 17 is a block diagram useful for explaining the circuit construction of the liquid crystal display device.

FIG. 17 shows an example of the circuit construction of the active matrix substrate shown in Embodiments 1 through 4. The drawing shows a circuit construction of a direct-view type display device. The active matrix substrate comprises an image signal driving circuit 186, scanning signal driving circuits (A) and (B) 185 and a pixel section 188. Incidentally, the term "driving circuit" used in this specification is a generic term that includes the image signal driving circuit 186 and the scanning signal driving circuit 185.

The image signal driving circuit 186 comprises a shift register circuit 501a, a level shifter circuit 502a, a buffer circuit 503a and a sampling circuit 504. The scanning signal driving circuits (A) and (B) 185 comprise a shift register circuit 501b, a level shifter circuit 502b and a buffer circuit 503b.

Shift register circuits 501a and 501b use a driving voltage of 5 to 16 V (typically, 10 V). The TFT constituting the CMOS circuit for forming this circuit comprises the first p-channel TFT 200 and the first n-channel TFT 201 shown in FIG. 3C. The driving voltages of the level shifter circuits 502a and 502b and the buffer circuits 503a and 503b are as high as 14 to 16 V, but the TFTs similar to that of the shift register circuit may be used. The withstand voltage can be improved when these circuits are constituted into the multi-gate structure, and reliability of the circuit can be improved effectively.

A sampling circuit 504 comprises an analog switch and its driving voltage is 14 to 16 V. Since this circuit is driven while its polarity is alternately reversed and moreover, since the OFF current value must be lowered, the sampling circuit 504 preferably comprises the second p-channel TFT 202 and the second n-channel TFT 203 shown in FIG. 3C. When the OFF current value of the p-channel TFT 202 becomes the problem in this circuit, the TFT having the single drain structure having the offset region and fabricated in Embodiment 2 is preferably used.

The driving voltage of the pixel section is 14 to 16 V. The OFF current value must be further lowered than in the sampling circuit from the aspect of low power consumption. Therefore, the TFT having the multi-gate structure and further having the LDD region, such as the pixel TFT 204 shown in FIG. 3C, is preferably used.

The constitutions of this embodiment can be achieved easily by manufacturing the TFTs in accordance with the process steps shown in Embodiments 1 through 4. Though this embodiment shows only the constructions of the pixel section and the driving circuit, it is possible to form other circuits such as a signal divider circuit, a frequency divider circuit, a D/A converter, a γ correction circuit, an operational amplifier circuit, a signal processing circuit such as a memory circuit and an arithmetic processing circuit, or a logic circuit, over the same substrate in accordance with the process steps of Embodiments 1 through 4. As described above, the present invention can accomplish a semiconductor device comprising a pixel section and the driving circuit over a substrate, for example, a liquid crystal display device comprising the pixel section and the signal controlling circuit over a substrate.

Embodiment 8

The active matrix substrate, the liquid crystal display device and the EL display device fabricated in accordance with the present invention can be used for various electro-optical devices. The present invention can be applied to all those electronic appliances that include such an electro-optical device as the display medium. Examples of the electronic appliances include a personal computer, a digital camera, a video camera, a portable information terminal (a mobile computer, a cellular telephone, an electronic book), and a navigation system. FIG. 22A to 22F show examples of these.

FIG. 22A shows a personal computer, which comprises: a main body 2001 comprising a microprocessor and a memory; an image input section 2002; a display device 2003; and a keyboard 2004. The present invention can form the display device 2003 or other signal processing circuits.

FIG. 22B shows a video camera, which comprises: a main body 2101; a display device 2102; a sound input section 2103; an operation switch 2104; a battery 2105; and an image receiving section 2106. The present invention can be applied to the display device 2102 or other signal control circuits.

FIG. 22C shows the portable information terminal, that comprises: a main body 2201; an image input section 2202; an image receiving section 2203; an operation switch 2204; and a display device 2205. The present invention can be applied to the display device 2205 or other signal controlling circuits.

Figure 21A:
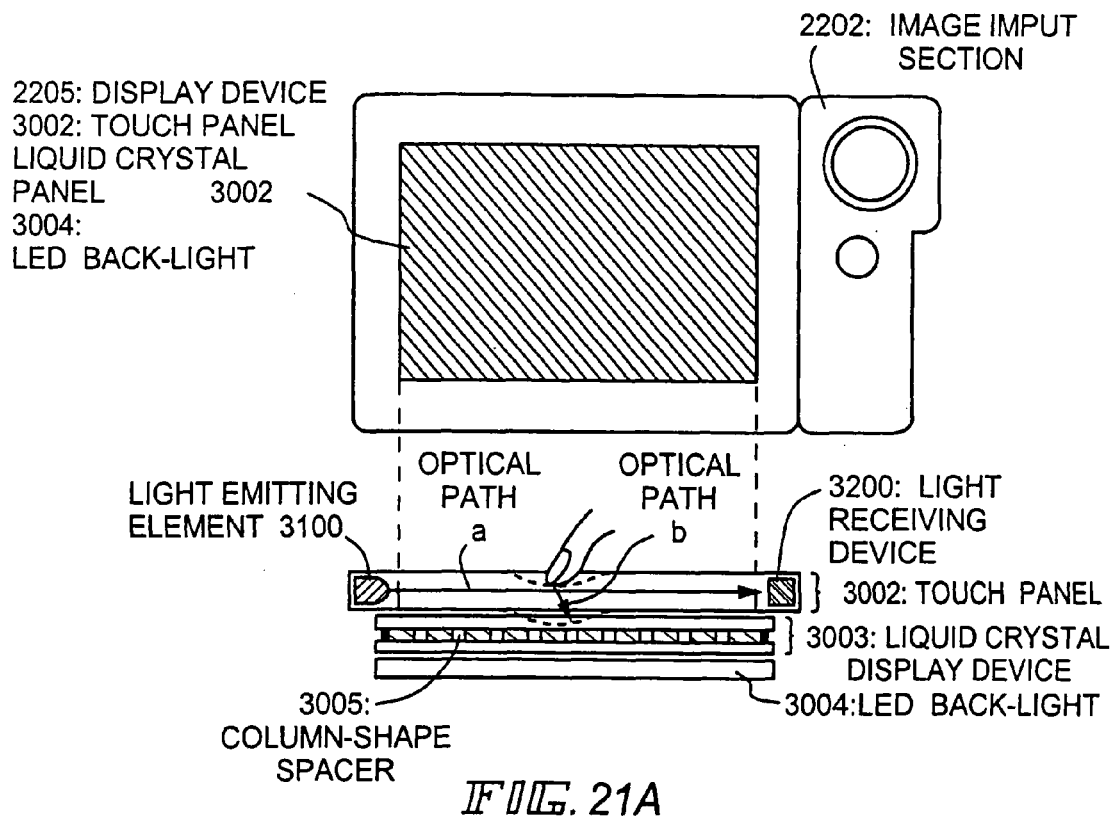
FIGS. 21A and 21B is a schematic view showing an example of semiconductor devices.

Such a portable information terminal is often used indoors as well as outdoors. To operate the terminal for a long time, a reflection type liquid crystal display device utilizing external light is more suitable for the low power consumption type than the type using back-light. However, when the environment is dark, a transmission type liquid crystal display device quipped with back-light is more suitable. Under such circumstances, a hybrid type liquid crystal display device having the features of both reflection type and transmission type has been developed. The present invention can be also applied to such a hybrid type liquid crystal display device. FIG. 21 shows an example of such an application to the portable information terminal. The display device 2205 comprises a touch panel 3002, a liquid crystal display device 3003 and LED back-light 3004. The touch panel 3002 is provided so as to easily operate the portable information terminal. A light emitting element 3100 such as LED is disposed at one of the ends of the touch panel 3002 and a light receiving device 3200 such as a photo-diode is disposed at the other end. An optical path is defined between them. When the touch panel 3002 is pushed and the optical path is cut off, the output of the light receiving element 3200 changes. When these light emitting elements and light receiving elements are disposed in matrix on the liquid crystal display device by utilizing this principle, the touch panel can be allowed to function as the input medium.

Figure 21B:
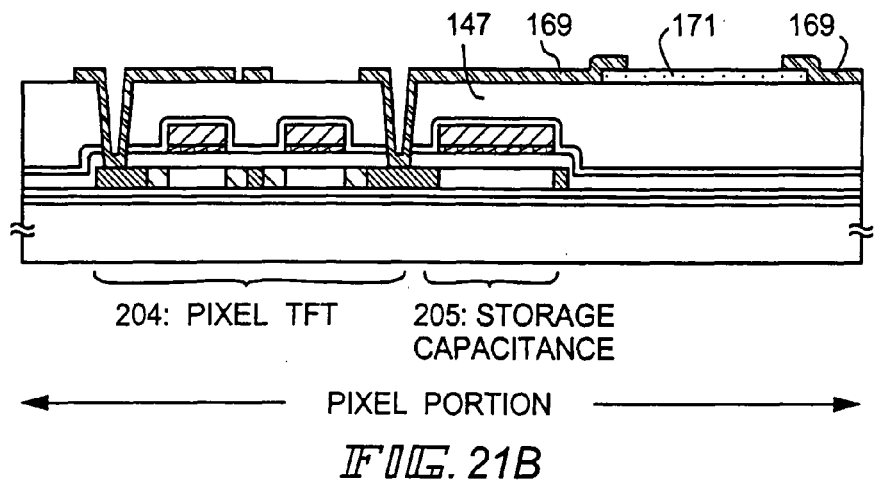

FIG. 21B shows the construction of the pixel section of the hybrid type liquid crystal display device. A drain electrode 169 and a pixel electrode 171 are disposed on an interlayer insulating film 147. Such a construction can be achieved by applying Embodiment 4. The drain electrode has a laminate structure of a Ti film and an Al film and operates also as the pixel electrode. The pixel electrode 171 is made of the transparent conductive film material explained in Embodiment 4. As the liquid crystal display device 3003 is fabricated from the active matrix substrate, it can be used suitably for the portable information terminal.

FIG. 22D shows an electronic game machine such as a television game or a video game. It comprises a main body 2301 having mounted thereto an electronic circuit 2308 such as a CPU, a recording medium 2304, etc.; a controller 2305; a display device 2303; and a display device 2302 that is assembled in the main body 2301. The display device 2303 and the display device 2302 assembled in the main body 2301 may display the same information. Alternatively, the latter may be used mainly as a main display device and the latter, as a sub-display device to display the information of the recording medium 2304, the operation condition of the apparatus or as an operation board by adding the function of a touch sensor. The main body 2301, the controller 2305 and the display device 2303 may have wire communication functions to transmit signals between them, or may be equipped with sensor units 2306 and 2307 for achieving wireless communication or optical communication function. The present invention can be applied to the display devices 2302 and 2303. A conventional CRT may be used for the display device 2303.

FIG. 22E shows a player that uses a recording medium storing a program (hereinafter called the "recording medium"). It comprises a main body 2401, a display device 2402, a speaker unit 2403, a recording medium 2404 and an operation switch 2405. Incidentally, a DVD (Digital Versatile Disc) or a compact disk (CD) can be used for the recording medium to reproduce a music program or to display images or information display such as a video game (or a television game) and information display through the Internet. The present invention can be utilized suitably for the display device 2402 and other signal control circuits.

FIG. 22F shows a digital camera, which comprises: a main body 2501; a display device 2502; a view finder section 2503; an operation switch 2504; and an image reception unit (not shown). The present invention can be applied to the display unit 2502 or other signal control circuits.

Figure 23A:
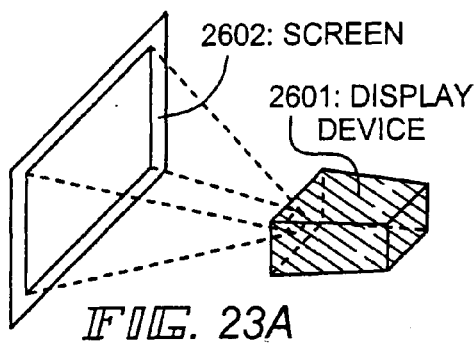
FIG. 23A to 23D are diagrams showing an example of the projection type liquid crystal display devices.
Figure 23B:
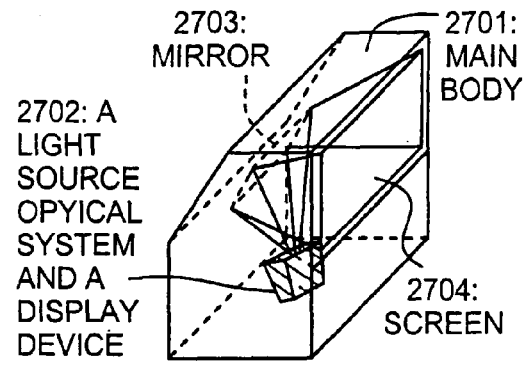

FIG. 23A shows a front type projector, which comprises: a light source optical system and a display device 2601; and a screen 2602. The present invention can be applied to the display device and other signal control circuits. FIG. 23B shows a rear type projector, which comprises: a main body 2701; a light source optical system and a display device 2702; a mirror 2703; and a screen 2704. The present invention can be applied to the display device or other signal control circuit.

Figure 23C:
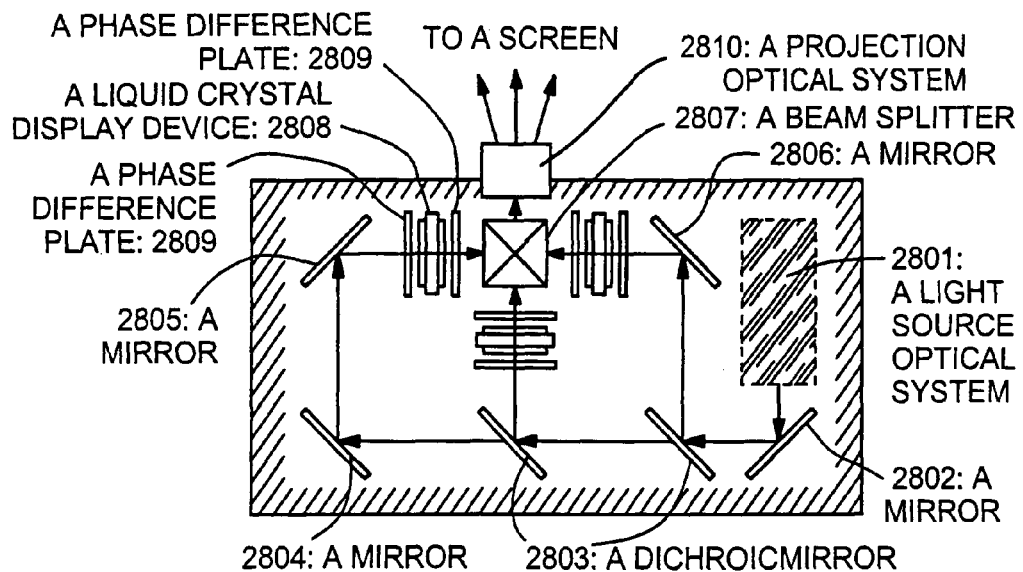
Figure 23D:
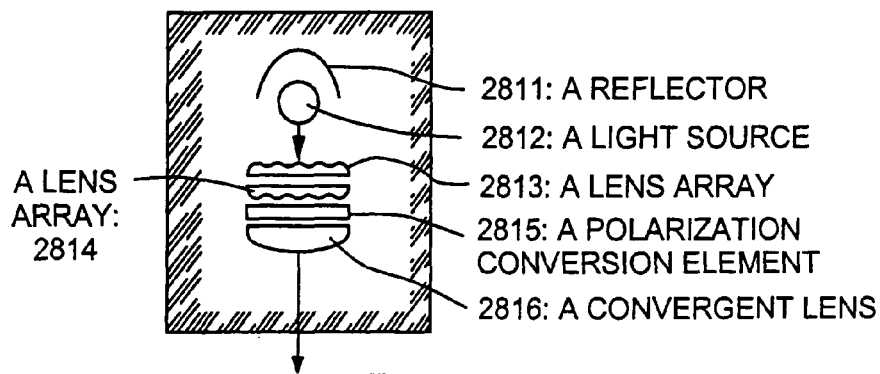

Incidentally, FIG. 23C shows an example of the construction of the light source optical system and the display devices 2601 and 2702 in FIGS. 23A and 23B. The light source optical system and the display device 2601 and 2702 comprise a light source optical system 2801, mirrors 2802, 2804 to 2806, a dichroic mirror 2803, a beam splitter 2807, a liquid crystal display device 2808, a phase difference plate 2809 and a projection optical system 2810. The projection optical system 2810 comprises a plurality of optical lenses. FIG. 23C shows an example of the three-plate system that uses three liquid crystal display devices 2808. However, the present invention is not limited to such a system, but may be applied to a single-plate optical system. Optical lenses, a film having a polarization function, a film for adjusting the phase, an IR film, etc, may be inserted appropriately in the optical path indicated by an arrow in FIG. 23C. FIG. 23D shows a structural example of the light source optical system 2801 in FIG. 23C. In this embodiment, the light source optical system 2801 comprises: a reflector 2811; a light source 2812; lens arrays 2813 and 2814; a polarization conversion element 2815; and a convergent lens 2816. Incidentally, the light source optical system shown in FIG. 23D is an example but is in no way restrictive.

The present invention can be applied to a read circuit of a navigation system or an image sensor, though they are not shown in the drawings. The application range of the present invention is thus extremely broad, and the present invention can be applied to electronic appliances of all fields. The electronic appliances of this embodiment can be accomplished by the crystallization techniques of Embodiments 1 through 4.

When the present invention is employed, the TFTs having suitable performance can be arranged in accordance with the specification required by each functional circuit in the semiconductor devices (concretely, the electro-optical devices here) having a plurality of functional circuits formed on the same substrate. Moreover, the operation characteristics of such TFTs can be drastically improved.

According to the manufacturing method of the semiconductor device of the present invention, the active matrix substrate, in which the p-channel TFT of the driving circuit has the single drain structure, the n-channel TFT has the GOLD structure or the LDD structure, and the pixel TFT of the pixel section has the LDD structure, can be fabricated by using six photo-masks. A reflection type liquid crystal display device can be fabricated from such an active matrix substrate. A transmission type liquid crystal display device can be fabricated in accordance with the same process steps by using seven photo-masks.

According to the manufacturing method of the semiconductor device of the present invention, an active matrix substrate, in which the p-channel TFT of the driving circuit has the single drain structure having the offset region, the n-channel TFT has the GOLD structure or the LDD structure, and pixel TFT of the pixel section has the LDD structure, can be fabricated by using seven photo-masks. The reflection type liquid crystal device can be fabricated from such an active matrix substrate. A transmission type liquid crystal display device can be fabricated in accordance with the same process steps by using eight photo-masks.

According to the present invention, with respect to the TFTs having the gate electrode formed from the heat-resistant conductive material and the gate wiring of formed from the low resistance conductive material, the fabrication method of the active material substrate in which the p-channel TFT of the driving circuit has the single drain structure, the n-channel TFT has the GOLD structure and the LDD structure, and the pixel TFT of the pixel section has the LDD structure, by using seven photo-masks. The reflection type liquid crystal display device can be fabricated from such an active matrix substrate. The transmission type liquid crystal display device can be fabricated in accordance with the same process steps by using eight photo-masks.

As described above, the number of photo-masks necessary for fabricating the active matrix substrate is limited to 6 to 8. In consequence, the fabrication process can be simplified, and the production cost can be drastically reduced.

What is claimed is:

1. A semiconductor device comprising:
    a pixel TFT and a capacitor disposed in a pixel section over a substrate; and
    a driver circuit comprising a p-channel TFT and an n-channel TFT, over the substrate;
    a first interlayer insulating film comprising an inorganic insulating material over a gate electrode of the pixel TFT;
    a second interlayer insulating film comprising an organic insulating material over the first interlayer insulating film; and
    a pixel electrode having a light reflective surface over the second interlayer insulating film, and electrically connected with the pixel TFT through an opening in the first and second interlayer insulating films,
    wherein the p-channel TFT of the driver circuit comprises a channel forming region, a source region and a drain region in contact with the channel forming region, and a gate electrode over the channel forming region,
    wherein an edge of the source region of the p-channel TFT in contact with the channel forming region is aligned with an edge of the gate electrode, and an edge of the drain region of the p-channel TFT in contact with the channel forming region is aligned with another edge of the gate electrode,
    wherein the n-channel TFT of the driver circuit comprises a channel forming region, a first n-type impurity region of a first concentration which forms at least one LDD region in contact with the channel forming region and partly overlapping a gate electrode, and a source region and a drain region in contact with the at least one LDD region,
    wherein the pixel TFT comprises a channel forming region, a second n-type impurity region which forms at least one LDD region in contact with the channel forming region, and a source region and a drain region in contact with the at least one LDD region,
    wherein the capacitor comprises a third n-type impurity region of the first concentration, and
    wherein the first n-type impurity region and the third n-type impurity region exist in a same semiconductor layer.

2. A semiconductor device according to claim 1 wherein the semiconductor device is in an apparatus selected from a group consisting of a personal computer, a video camera, a portable information terminal, a digital camera, a digital video disc player, an electronic game machine and a projector.

3. A semiconductor device comprising:
    a pixel TFT and a capacitor disposed in a pixel section over a first substrate;
    a driver circuit comprising a p-channel TFT and an n-channel TFT over the first substrate;
    a first interlayer insulating film comprising an inorganic insulating material over a gate electrode of the pixel TFT;
    a second interlayer insulating film comprising an organic insulating material over the first interlayer insulating film; and
    a pixel electrode having a light reflective surface over the second interlayer insulating film, and electrically connected with the pixel TFT through an opening in the first and second interlayer insulating films,
    at least one columnar spacer covering the opening;
    a second substrate having a transparent conductive film stuck to the first substrate through the at least one columnar spacer; and
    a liquid crystal sandwiched between the first and second substrates,
    wherein the p-channel TFT of the driver circuit comprises a channel forming region a source region and a drain region in contact with the channel forming region, and a gate electrode over the channel forming region,
    wherein an edge of the source region of the p-channel TFT in contact with the channel forming region is aligned with an edge of the gate electrode, and an edge of the drain region of the p-channel TFT in contact with the channel forming region is aligned with another edge of the gate electrode
    wherein the n-channel TFT of the driver circuit comprises a channel forming region, a first n-type impurity region of a first concentration which forms at least one LDD region in contact with the channel forming region and partly overlapping a gate electrode, and a source region and a drain region in contact with the at least one LDD region,
    wherein the pixel TFT comprises a channel forming region, a second n-type impurity region which forms at least one LDD region in contact with the channel forming region, and a source region and a drain region in contact with the at least one LDD region,
    wherein the capacitor comprises a third n-type impurity region of the first concentration, and
    wherein the first n-type impurity region and the third n-type impurity region exist in a same semiconductor layer.

4. A semiconductor device according to claim 3 wherein a columnar spacer is formed over the p-channel TFT and the n-channel TFT of the driver circuit.

5. A semiconductor device according to claim 3 wherein a columnar spacer is formed to cover at least a source wiring or a drain wiring of the p-channel TFT and the n-channel TFT of the driver circuit.

6. A semiconductor device according to claim 3 wherein the semiconductor device is in an apparatus selected from a group consisting of a personal computer, a video camera, a portable information terminal, a digital camera, a digital video disc player, an electronic game machine and a projector.

7. A semiconductor device comprising:
a pixel TFT and a capacitor disposed in a pixel section over a substrate;
a driver circuit comprising a p-channel TFT and an n-channel TFT over the substrate,
a first interlayer insulating film comprising an inorganic insulating material formed over the pixel section;
a second interlayer insulating film comprising an organic insulating material over the first interlayer insulating film;
a pixel electrode having a light reflective surface over the second interlayer insulating film, and in connected to the pixel TFT through an opening formed in the first and second interlayer insulating films;
a source wiring over the second interlayer insulating film;
an alignment film formed over the pixel electrode and the source wiring; and
a liquid crystal interposed between the alignment film and an opposed substrate,
wherein the p-channel TFT of the driver circuit comprises a channel forming region, a source region and a drain region in contact with the channel forming region, and a gate electrode over the channel forming region,
wherein an edge of the source region of the p-channel TFT in contact with the channel forming region is aligned with an edge of the gate electrode, and an edge of the drain region of the p-channel TFT in contact with the channel forming region is aligned with another edge of the gate electrode
wherein the n-channel TFT of the driver circuit comprises a channel forming region, a first n-type impurity region of a first concentration which forms at least one LDD region in contact with the channel forming region and partly overlapping a gate electrode, and a source region and a drain region in contact with the at least one LDD region,
wherein the pixel TFT comprises a channel forming region, a second n-type impurity region which forms at least one LDD region in contact with the channel forming region, and a source region and a drain region in contact with the at least one LDD region,
wherein the capacitor comprises a third n-type impurity region of the first concentration, and
wherein the first n-type impurity region and the third n-type impurity region exist in a same semiconductor layer.

8. A semiconductor device according to claim 7 wherein a columnar spacer is formed over the p-channel TFT and the n-channel TFT of the driver circuit.

9. A semiconductor device according to claim 7 wherein a columnar spacer is formed to cover at least the source wiring or a drain wiring of the p-channel TFT and the n-channel TFT of the driver circuit.

10. A semiconductor device according to claim 7 wherein the semiconductor device is in an apparatus selected from a group consisting of a personal computer, a video camera, a portable information terminal, a digital camera, a digital video disc player, an electronic game machine and a projector.

11. A semiconductor device comprising:
a pixel TFT and a capacitor disposed in a pixel section over a substrate; and
a driver circuit comprising a p-channel TFT and an n-channel TFT, over the substrate;
wherein the p-channel TFT of the driver circuit comprises a channel forming region, a source region and a drain region in contact with the channel forming region, and a gate electrode over the channel forming region,
wherein an edge of the source region of the p-channel TFT in contact with the channel forming region is aligned with an edge of the gate electrode, and an edge of the drain region of the p-channel TFT in contact with the channel forming region is aligned with another edge of the gate electrode,
wherein the n-channel TFT of the driver circuit comprises a channel forming region, a first n-type impurity region of a first concentration which forms at least one LDD region in contact with the channel forming region and partly overlapping a gate electrode, and a source region and a drain region in contact with the at least one LDD region,
wherein the pixel TFT comprises a channel forming region, a second n-type impurity region which forms at least one LDD region in contact with the channel forming region, and a source region and a drain region in contact with the at least one LDD region,
wherein the capacitor comprises a third n-type impurity region of the first concentration, and
wherein the first n-type impurity region and the third n-type impurity region exist in a same semiconductor layer.

12. A semiconductor device according to claim 11 wherein a columnar spacer is formed over the p-channel TFT and the n-channel TFT of the driver circuit.

13. A semiconductor device according to claim 11 wherein a columnar spacer is formed to cover at least a source wiring or a drain wiring of the p-channel TFT and the n-channel TFT of the driver circuit.

14. A semiconductor device according to claim 11 wherein the semiconductor device is in an apparatus selected from a group consisting of a personal computer, a video camera, a portable information terminal, a digital camera, a digital video disc player, an electronic game machine and a projector.

* * * * *